United States Patent
Fujioka et al.

(10) Patent No.: US 9,247,166 B2
(45) Date of Patent: Jan. 26, 2016

(54) SOLID-STATE IMAGE SENSOR, SOLID-STATE IMAGING DEVICE, AND CAMERA DEVICE

(71) Applicant: SONY CORPORATION, Tokyo (JP)

(72) Inventors: Takeshi Fujioka, Fukuoka (JP); Tomoki Kurose, Kanagawa (JP); Hiroaki Tanaka, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 14/410,203

(22) PCT Filed: Jun. 25, 2013

(86) PCT No.: PCT/JP2013/067363
§ 371 (c)(1),
(2) Date: Dec. 22, 2014

(87) PCT Pub. No.: WO2014/007108
PCT Pub. Date: Jan. 9, 2014

(65) Prior Publication Data
US 2015/0334322 A1  Nov. 19, 2015

(30) Foreign Application Priority Data
Jul. 3, 2012  (JP) .................. 2012-149552

(51) Int. Cl.
*H04N 5/367* (2011.01)
*H01L 27/148* (2006.01)
*H04N 5/3728* (2011.01)
*H04N 5/361* (2011.01)
*H04N 5/378* (2011.01)
*H04N 5/232* (2006.01)

(52) U.S. Cl.
CPC .......... *H04N 5/367* (2013.01); *H01L 27/14812* (2013.01); *H01L 27/14831* (2013.01); *H04N 5/23293* (2013.01); *H04N 5/361* (2013.01); *H04N 5/378* (2013.01); *H04N 5/3728* (2013.01)

(58) Field of Classification Search
CPC ...................... H01L 27/1485; H01L 27/14812
See application file for complete search history.

(56) References Cited

U.S. PATENT DOCUMENTS

| | | | | |
|---|---|---|---|---|
| 5,729,287 A * | 3/1998 | Morimoto | ............. | H04N 5/235 348/241 |
| 6,198,507 B1 * | 3/2001 | Ishigami | ................ | H04N 9/045 348/273 |
| 6,707,495 B1 * | 3/2004 | Harada | ............. | H01L 27/14812 257/232 |
| 2011/0024854 A1 * | 2/2011 | Suzuki | ................ | H01L 27/1485 257/431 |

FOREIGN PATENT DOCUMENTS

| JP | 2000-077647 A | 3/2000 |
|---|---|---|
| JP | 2005-005512 A | 1/2005 |
| JP | 2007-201087 A | 8/2007 |

OTHER PUBLICATIONS
International Search Report prepared by the Japanese Patent Office on Aug. 27, 2013, for International Application No. PCT/JP2013/067363.

* cited by examiner

*Primary Examiner* — James Hannett
(74) *Attorney, Agent, or Firm* — Sheridan Ross P.C.

(57) ABSTRACT

The present technology relates to a solid-state image sensor, a solid-state imaging device, and a camera device capable of making white flaws unnoticeable even with a reduced cell size.

The solid-state image sensor includes: a register unit formed as an n-type impurity region extending in a first direction; a reading unit configured to read charge from the photoelectric conversion unit into the register unit and formed as a p-type impurity region extending in the same direction as the register unit; a horizontal element isolation unit configured to prevent leakage of charge from the photoelectric conversion unit and formed as a p-type impurity region extending in the same direction as the register unit; and multiple transfer electrodes configured to apply voltage for changing potential distribution of the register unit, wherein a total amount of n-type impurity forming the register unit below a low-level electrode having a standby voltage of a predetermined low value among the transfer electrodes is smaller than a total amount of n-type impurity forming the register unit below a middle-level electrode having a standby voltage higher than the predetermined low value.

13 Claims, 32 Drawing Sheets

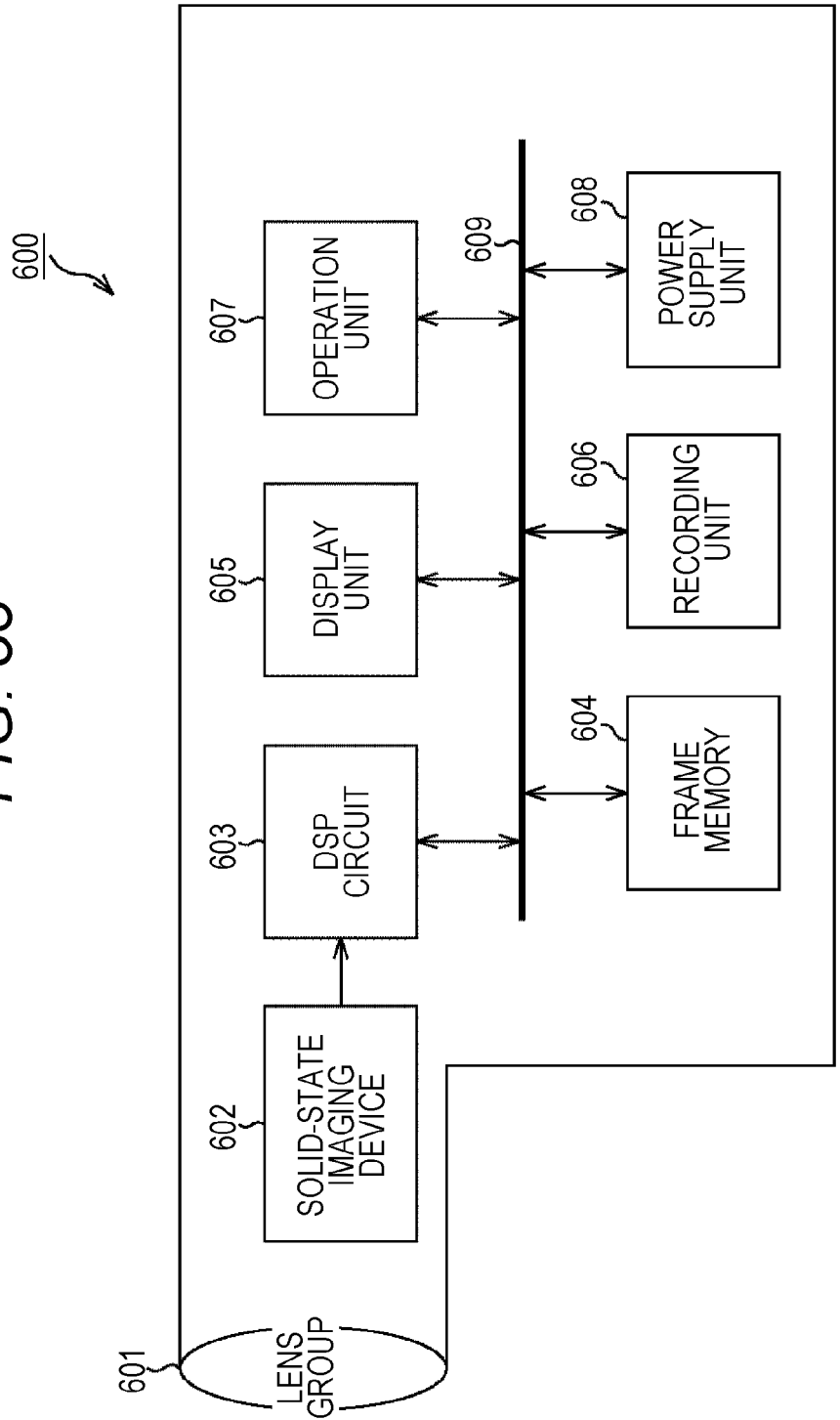

US 9,247,166 B2

SOLID-STATE IMAGE SENSOR, SOLID-STATE IMAGING DEVICE, AND CAMERA DEVICE

CROSS REFERENCE TO RELATED APPLICATIONS

This application is a national stage application under 35 U.S.C. 371 and claims the benefit of PCT Application No. PCT/JP2013/067363 having an international filing date of Jun. 25, 2013, which designated the United States, which PCT application claimed the benefit of Japanese Patent Application No. 2012-149552 filed Jul. 3, 2012, the disclosures of the above-identified applications are incorporated herein by reference in their entirety.

TECHNICAL FIELD

The present technology relates to a solid-state image sensor, a solid-state imaging device, and a camera device, and in particular to a solid-state image sensor, a solid-state imaging device, and a camera device capable of making white flaws unnoticeable even with a reduced cell size.

BACKGROUND ART

Solid-state imaging devices using charge-coupled devices (CCDs) are known as examples of solid-state imaging devices.

A CCD solid-state image sensor includes multiple photosensor units using photoelectric transducers, that is, photodiodes (PDs) configured to generate and store signal charge of an amount corresponding to the amount of received light, which are arranged in a two-dimensional matrix. The signal charge is generated and stored on the basis of light signals from a subject incident on the photodiodes of the multiple photosensor units. The stored signal charge is transferred in the vertical direction by a vertical transfer register arranged for each column of the photosensor units and transferred in the horizontal direction by a horizontal transfer register having a CCD structure. The signal charge transferred in the horizontal direction is output as image information of the subject from an output unit having a charge-voltage converter.

A solid-state image sensor has multiple pixels composed of multiple photosensor units that are photodiodes arranged in horizontal and vertical directions, reading units, and vertical transfer channels, for example.

Each photosensor unit includes a signal charge storage part and a hole accumulation region formed in a p-type semiconductor well region of a substrate made of an n-type semiconductor.

The signal charge storage part is formed by an n-type impurity region. The hole accumulation region is formed by a p-type impurity region (p+) and formed on the surface of the signal charge storage part.

Each vertical transfer channel is formed in the n-type impurity region at a predetermined distance from the photosensor units. In addition, a p-type impurity region (p) is formed between a vertical transfer channel and a photosensor unit to be read on one side thereof and functions as a reading unit. Furthermore, a horizontal element isolation unit made of a p-type impurity region (p+) is formed between the vertical transfer channel and a photosensor unit that is not to be read on the other side thereof. Furthermore, vertical element isolation units made of p-type impurity regions (p+) are formed at both ends of a photosensor unit.

The horizontal element isolation units isolate the respective photosensor units in the horizontal direction, and the vertical element isolation units isolate the respective photosensor units in the vertical direction. The vertical element isolation units, the horizontal element isolation units, and the reading units are each formed in contact with the vertical transfer channels.

First transfer electrodes and second transfer electrodes are formed alternately above the reading units and the vertical transfer channels with an insulating film therebetween. The vertical transfer channels, the first transfer electrodes, and the second transfer electrodes constitute the vertical transfer registers.

As a method for forming vertical transfer registers in a microcell, a technology of allowing the line widths of vertical transfer channels to be reduced and suppressing occurrence of potential barriers in potential distribution of the vertical transfer channels to improve the efficiency of transferring signal charge has been proposed (refer to Patent Document 1, for example).

CITATION LIST

Patent Documents

Patent Document 1: JP 2010-80791 A

SUMMARY OF THE INVENTION

Problems to be Solved by the Invention

Note that, in CCD solid-state image sensors, the influence of white lines (white flaws) caused in vertical transfer registers on the image quality has been a concern. The white flaws are caused by crystal defects of n-type impurity doped as the vertical transfer registers. Thus, to reduce the influence of the white flaws, it is desirable to reduce the amount of n-type impurity doped as the vertical transfer registers.

With the decrease in the cell size in recent years, however, the line widths of vertical transfer registers and element isolation units are decreased and impurities are doped at high concentrations to form transfer channels and the element isolation units. White flaws thus tend to be worse as a result of defects formed at the substrate. Furthermore dark current components from the defects tend to be enhanced owing to an intense electric field at p-n junctions with high concentrations. As a result, white lines occur more significantly in microcells.

With the conventional technologies as in Patent Document 1, it is difficult to reduce the total amount of impurity doped into the entire vertical transfer registers, and as a result, sufficient effects of improving white lines cannot be produced.

The present technology is disclosed in view of these circumstances, and allows white flaws to be unnoticeable even with a reduced cell size.

Solutions to Problems

A first aspect of the present technology is a solid-state image sensor including: a register unit configured to transfer charge stored in a photoelectric conversion unit and formed as an n-type impurity region extending in a first direction; a reading unit configured to read charge from the photoelectric conversion unit into the register unit and formed as a p-type impurity region extending in the same direction as the register unit; a horizontal element isolation unit configured to prevent leakage of charge from the photoelectric conversion unit and formed as a p-type impurity region extending in the same direction as the register unit; and multiple transfer electrodes configured to apply voltage for changing potential distribution of the register unit, wherein a total amount of n-type impurity forming the register unit below a low-level electrode having a standby voltage of a predetermined low value among the transfer electrodes is smaller than a total amount of n-type impurity forming the register unit below a middle-level electrode having a standby voltage higher than the predetermined low value.

In the second direction perpendicular to the first direction, a width of n-type impurity forming the register unit below the low-level electrode may be smaller than a width of n-type impurity forming the register unit below the middle-level electrode.

A concentration of n-type impurity forming the register unit below the low-level electrode may be lower than a concentration of n-type impurity forming the register unit below the middle-level electrode.

In the second direction perpendicular to the first direction, a highest concentration position below the low-level electrode may be closer to the photoelectric conversion unit than a highest concentration position below the middle-level electrode, the highest concentration positions being positions where impurity concentration of the p-type impurity region forming the reading unit or the horizontal element isolation unit is highest.

Only for highest concentration positions in the p-type impurity region forming the reading unit among the highest concentration positions, the highest concentration position below the low-level electrode may be closer to the photoelectric conversion unit than the highest concentration position below the middle-level electrode.

Only for highest concentration positions in the p-type impurity region forming the horizontal element isolation unit among the highest concentration positions, the highest concentration position below the low-level electrode may be closer to the photoelectric conversion unit than the highest concentration position below the middle-level electrode.

N-type impurity concentration of the sensor unit at a position corresponding to that of the low-level electrode may be higher than n-type impurity concentration of the sensor unit at a position corresponding to that of the middle-level electrode.

P-type impurity concentration of a surface of the sensor unit at a position corresponding to that of the low-level electrode may be lower than p-type impurity concentration of a surface of the sensor unit at a position corresponding to that of the middle-level electrode.

A second aspect of the present invention is a solid-state imaging device including: a register unit configured to transfer charge stored in a photoelectric conversion unit and formed as an n-type impurity region extending in a first direction; a reading unit configured to read charge from the photoelectric conversion unit into the register unit and formed as a p-type impurity region extending in the same direction as the register unit; a horizontal element isolation unit configured to prevent leakage of charge from the photoelectric conversion unit and formed as a p-type impurity region extending in the same direction as the register unit; multiple transfer electrodes configured to apply voltage to the register unit; and a timing generation circuit configured to supply voltage to the transfer electrodes to change potential distribution of the register unit, wherein a total amount of n-type impurity forming the register unit below a low-level electrode having a standby voltage of a predetermined low value among the transfer electrodes is smaller than a total amount of n-type impurity forming the register unit below a middle-level electrode having a standby voltage higher than the predetermined low value.

A third aspect of the present invention is a camera device including: a solid state image sensor including: a register unit configured to transfer charge stored in a photoelectric conversion unit and formed as an n-type impurity region extending in a first direction; a reading unit configured to read charge from the photoelectric conversion unit into the register unit and formed as a p-type impurity region extending in the same direction as the register unit; a horizontal element isolation unit configured to prevent leakage of charge from the photoelectric conversion unit and formed as a p-type impurity region extending in the same direction as the register unit; and multiple transfer electrodes configured to apply voltage for changing potential distribution of the register unit, wherein a total amount of n-type impurity forming the register unit below a low-level electrode having a standby voltage of a predetermined low value among the transfer electrodes is smaller than a total amount of n-type impurity forming the register unit below a middle-level electrode having a standby voltage higher than the predetermined low value; an optical system configured to guide incident light to the solid state image sensor; and a signal processing circuit configured to process an image signal output from a solid-state image sensor.

The first to third aspects of the present technology include a register unit configured to transfer charge stored in a photoelectric conversion unit and formed as an n-type impurity region extending in a first direction; a reading unit configured to read charge from the photoelectric conversion unit into the register unit and formed as a p-type impurity region extending in the same direction as the register unit; a horizontal element isolation unit configured to prevent leakage of charge from the photoelectric conversion unit and formed as a p-type impurity region extending in the same direction as the register unit; and multiple transfer electrodes configured to apply voltage for changing potential distribution of the register unit, wherein a total amount of n-type impurity forming the register unit below a low-level electrode having a standby voltage of a predetermined low value among the transfer electrodes is smaller than a total amount of n-type impurity forming the register unit below a middle-level electrode having a standby voltage higher than the predetermined low value.

Effects of the Invention

According to the present technology, white flaws can be made to be unnoticeable even with a reduced cell size.

BRIEF DESCRIPTION OF DRAWINGS

FIG. 33 is a block diagram showing an example configuration of a camera device that is an electronic device to which the present technology is applied.

MODES FOR CARRYING OUT THE INVENTION

Figure 1:
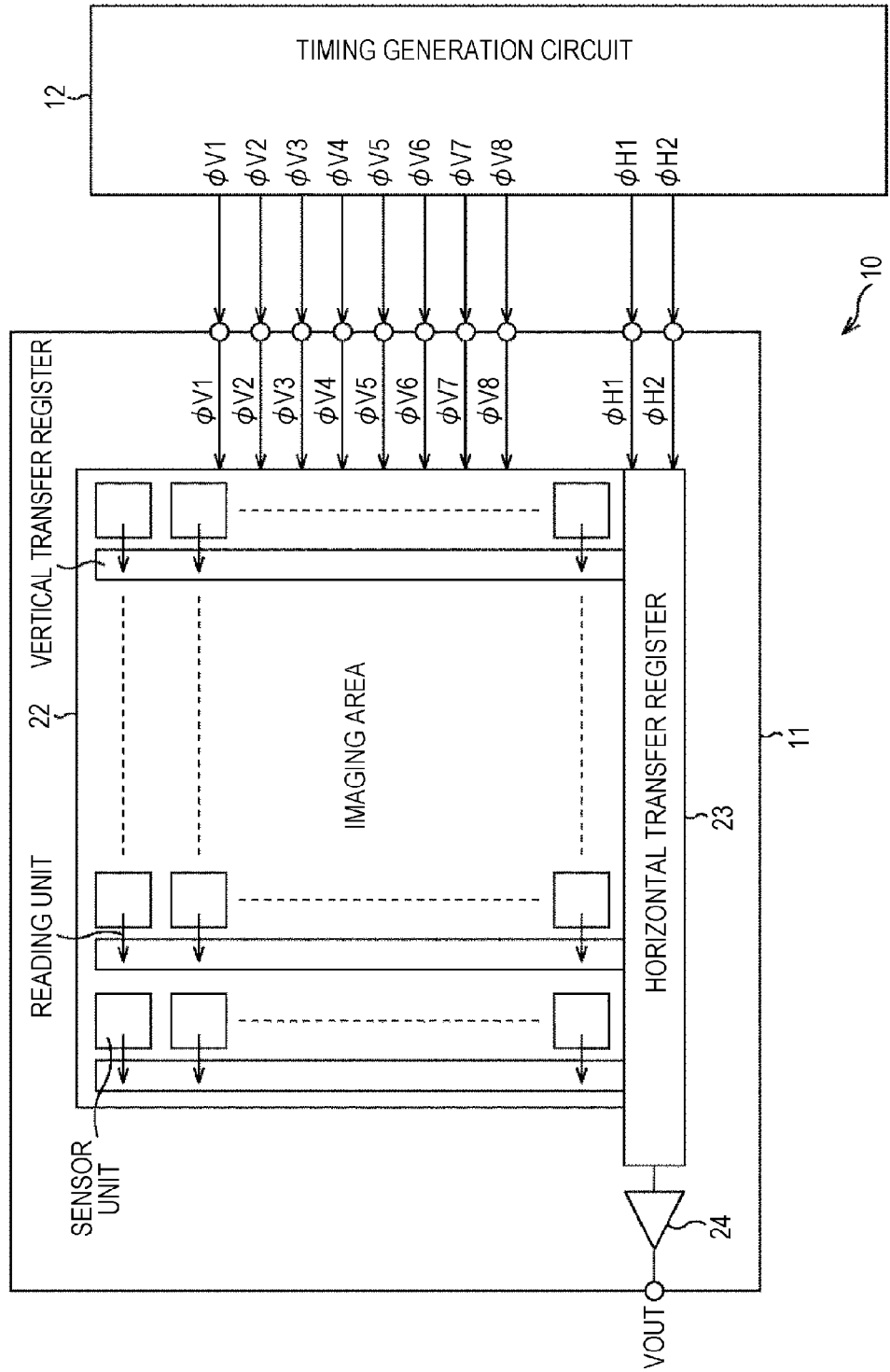
FIG. 1 is a block diagram showing a schematic configuration according to an embodiment of a solid-state imaging device to which the present technology is applied.

FIG. 1 is a block diagram showing a schematic configuration according to an embodiment of a solid-state imaging device to which the present technology is applied. The solid-state imaging device 10 shown in FIG. 1 includes a CCD image sensor 11 and a timing generation circuit 12.

The CCD image sensor 11 includes an imaging unit 22, a horizontal transfer register 23, and an output unit 24. The output unit 24 has a charge-voltage converter formed by a floating gate, for example.

The imaging unit 22 includes a large number of pixels composed of sensor units configured to perform photoelectric conversion, vertical transfer registers shown on the left side of the sensor units, and reading units configured to read signal charge stored in the sensor units (light receiving units) into the vertical transfer registers, which are arranged in a two-dimensional matrix.

The respective pixels are isolated by horizontal element isolation units (channel stoppers), which are not shown, so as not to electrically interfere with one another. Each vertical transfer register is shared by sensor units of each column, and a predetermined number of vertical transfer registers are arranged in the row direction. Vertical element isolation units, which are not shown, are also provided between the respective sensor units arranged in the vertical direction in FIG. 1, so that the sensor units do not electrically interfere with one another.

The imaging unit 22 receives as input vertical transfer clock signals $\phi V1$ to $\phi V8$ to drive the vertical transfer registers. The horizontal transfer register receives as input horizontal transfer clock signals $\phi H1$ and $\phi H2$ to drive the horizontal transfer register. The vertical transfer clock signals $\phi V1$ to $\phi V8$ and the horizontal transfer clock signals $\phi H1$ and $\phi H2$ are generated by the timing generation circuit 12.

The vertical transfer registers and the horizontal transfer register are each formed by a potential well for minority carriers formed as a result of introduction of impurity into a semiconductor substrate on the side of the surface and multiple electrodes (transfer electrodes) formed in a repeated manner and isolated on the substrate with an insulating film therebetween. The potential well for minority carriers mentioned above is also referred to as a "transfer channel."

The transfer clock signals ($\phi V1$ to $\phi V8$ or $\phi H1$ and $\phi H2$) described above are applied to the transfer electrodes of the vertical transfer registers and the horizontal transfer register with phases shifted periodically. The vertical transfer registers and the horizontal transfer register are controlled by the transfer clock signals applied to the transfer electrodes so that the potential distribution of the potential well changes sequentially, and function as what are called shift registers configured to transfer the charges in the potential well in the phase shift direction of the transfer clock signals.

The transfer electrodes are provided correspondingly to the respective sensor units and vertical element isolation units.

Next, a detailed configuration of the imaging unit 22 will be described.

Figure 2:
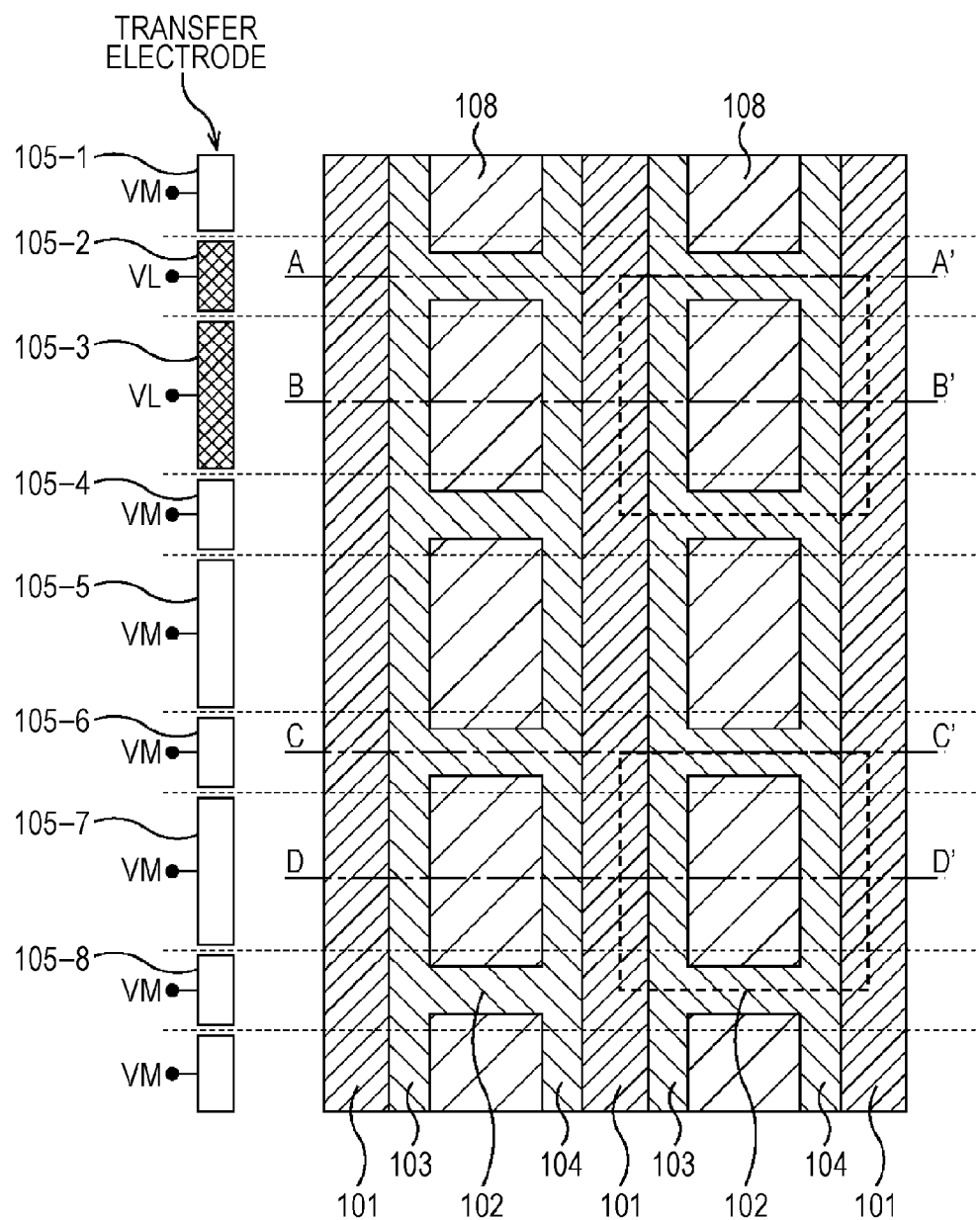
FIG. 2 is a plan view showing an example configuration of a conventional imaging unit.

FIG. 2 is an enlarged view of part of the imaging unit 22 in FIG. 1 in a form of a plan view showing an example configuration of a conventional imaging unit. In fact, FIG. 2 shows a shape of a mask used in a manufacturing process for attaching impurity to the substrate, and the configuration of the imaging unit on a completed substrate varies slightly according to the manufacturing process of the substrate.

In the example of FIG. 2, sensor units 108 formed as n-type impurity regions are arranged in the vertical direction in FIG. 2. In this example, two columns, which are a left column and a right column, of sensor units 108 are arranged. Note that a p-type impurity region is formed on the front surface (light receiving side) of each sensor unit 108 and a p-type impurity region (p-type well) is also formed on the bottom surface (substrate side) of the sensor unit 108.

A vertical element isolation unit 102 formed as a p-type impurity region is formed between sensor units adjacent to each other in the vertical direction in FIG. 2.

In addition, a reading unit 103 formed as a p-type impurity region is formed on the left side in FIG. 2 of each sensor unit 108.

Furthermore, a vertical transfer register 101 formed as an n-type impurity region is formed on the left side in FIG. 2 of each reading unit 103.

A horizontal element isolation unit 104 formed as a p-type impurity region is formed on the left side in FIG. 2 of each vertical transfer register 101.

Thus, each sensor 108 that is an n-type impurity region is surrounded by a reading unit 103 on the left side and a horizontal element isolation unit 104 on the right side, which are p-type impurity regions, and vertical element isolation units 102 on the upper and lower sides, which are p-type impurity regions. In this manner, each of the sensors 108 that are n-type impurity regions surrounded by p-type impurity regions constitutes a pixel arranged in the imaging unit 22.

Furthermore, the transfer electrodes described above are provided on the leftmost side in FIG. 2. As described above, transfer electrodes 105-1 to 105-8 are provided correspondingly to the respective sensor units and vertical element isolation units. In other words, the transfer electrodes 105-1 to 105-8 are provided at the same positions in the vertical direction as those of the respective sensor units 108 and the respective vertical element isolation units 102.

When the transfer electrodes 105-1 to 105-8 need not be individually distinguished, the transfer electrodes will be simply referred to as transfer electrodes 105.

Although the transfer electrodes 105 are shown only on the leftmost side in FIG. 2, the transfer electrodes 105 extend in the horizontal direction in FIG. 2.

FIGS. 3A and 3B show cross-sectional views along dashed-dotted lines A-A' and B-B' in FIG. 2. FIG. 3A is a cross-sectional view along the dashed-dotted line A-A' in FIG. 2 and FIG. 3B is a cross-sectional view along the dashed-dotted line B-B' in FIG. 2.

As shown in FIG. 3A, the transfer electrode 105-2 extends over the vertical element isolation units 102. In contrast, as shown in FIG. 3B, the transfer electrode 105-3 is not arranged over the sensor units 108.

Furthermore, as shown in FIG. 3B, a p-type impurity region 107 is formed on the front surface (light receiving side) of each sensor unit 108 and a p-type well 109 is formed on the bottom surface (substrate side) of the sensor unit 108.

As shown in FIGS. 3A and 3B, the transfer electrodes 105, the vertical transfer registers 101, the reading units 103, the horizontal element isolation units 104, and the like are formed on the substrate 110, and an insulating film 106 is arranged immediately under the transfer electrodes 105.

Figure 4:
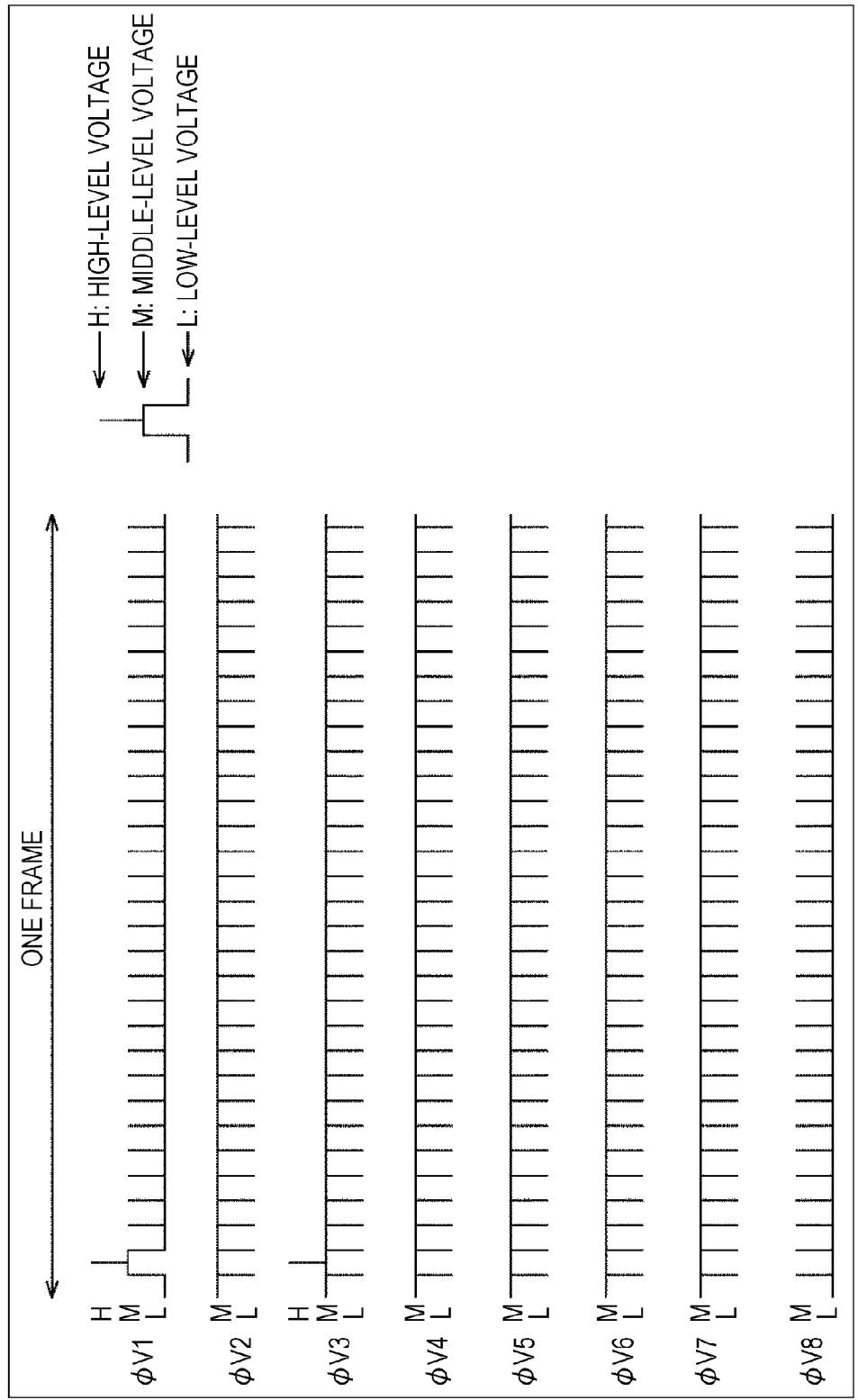
FIG. 4 is a timing chart of charge transfer when a moving image is captured by the solid-state imaging device.

FIG. 4 is a timing chart of charge transfer when a moving image is captured by the solid-state imaging device 10. In the example of FIG. 4, waveforms of the transfer clock signals φV1 to φV8 are shown. In FIG. 4, vertical lines actually represent pulses of the signals.

The waveforms of the transfer clock signals φV1 to φV8 change to voltage values of H (high-level voltage), M (middle-level voltage), and L (low-level voltage). For each of the signals, a part represented by a horizontal line corresponds to a standby voltage.

The middle-level voltage is a voltage of approximately 0 V, the high-level voltage is a positive voltage, and the low-level voltage is a negative voltage. Thus, when absolute values of voltages are referred to, the middle-level voltage has a small value and the high-level voltage and the low-level voltage have large values.

As shown in FIG. 4, the transfer clock signals φV1 to φV8 are applied to the transfer electrodes with phases shifted periodically. The vertical transfer registers are controlled by the transfer clock signals applied to the transfer electrodes so that the potential distribution of the potential well changes sequentially, and function as what are called shift registers configured to transfer the charges in the potential well in the phase shift direction of the transfer clock signals.

Figure 5:
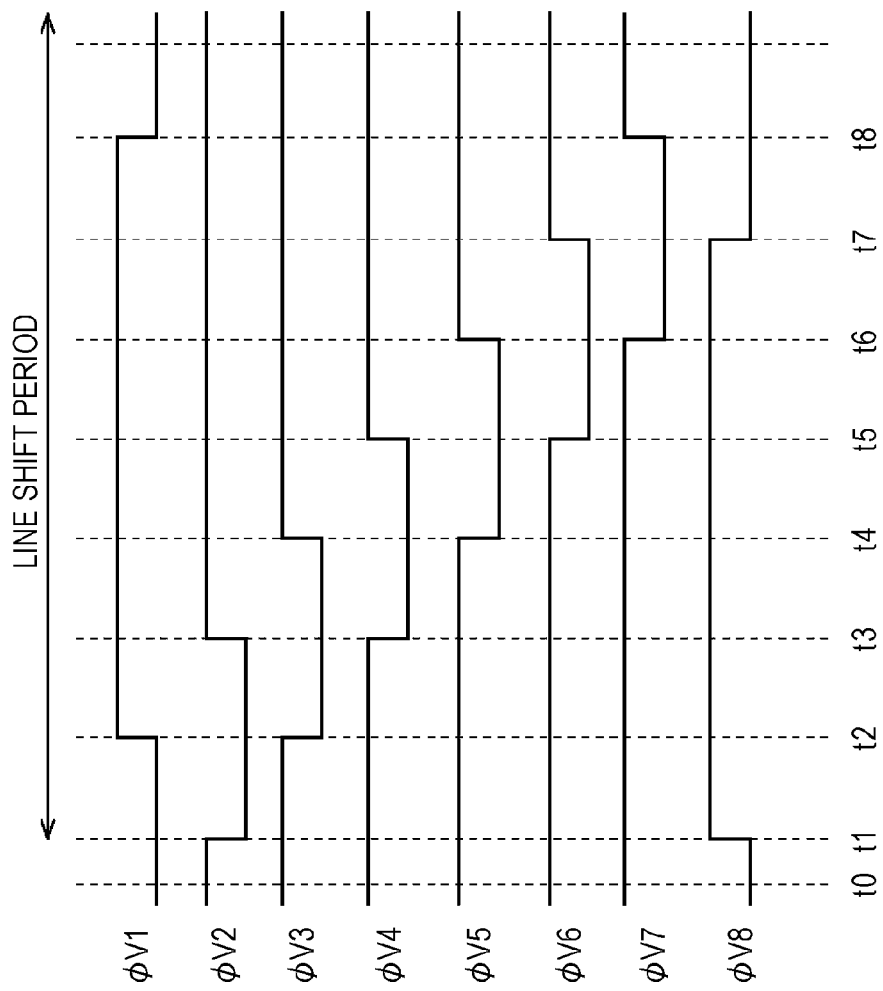
FIG. 5 is an enlarged chart of waveforms of transfer clock signals in FIG. 4.

FIG. 5 is an enlarged chart of the waveforms of the transfer clock signals φV1 to φV8 in FIG. 4 immediately after the transfer clock signal φV1 has become H and charges are read from the sensor units 108 into the vertical transfer registers 101, for example. In this example, the waveforms of the transfer clock signals φV1 to φV8 at time t0 to time t8 are shown. As shown in FIG. 5, the transfer clock signals φV1 to φV8 are pulsed with shifted phases.

Figure 6:
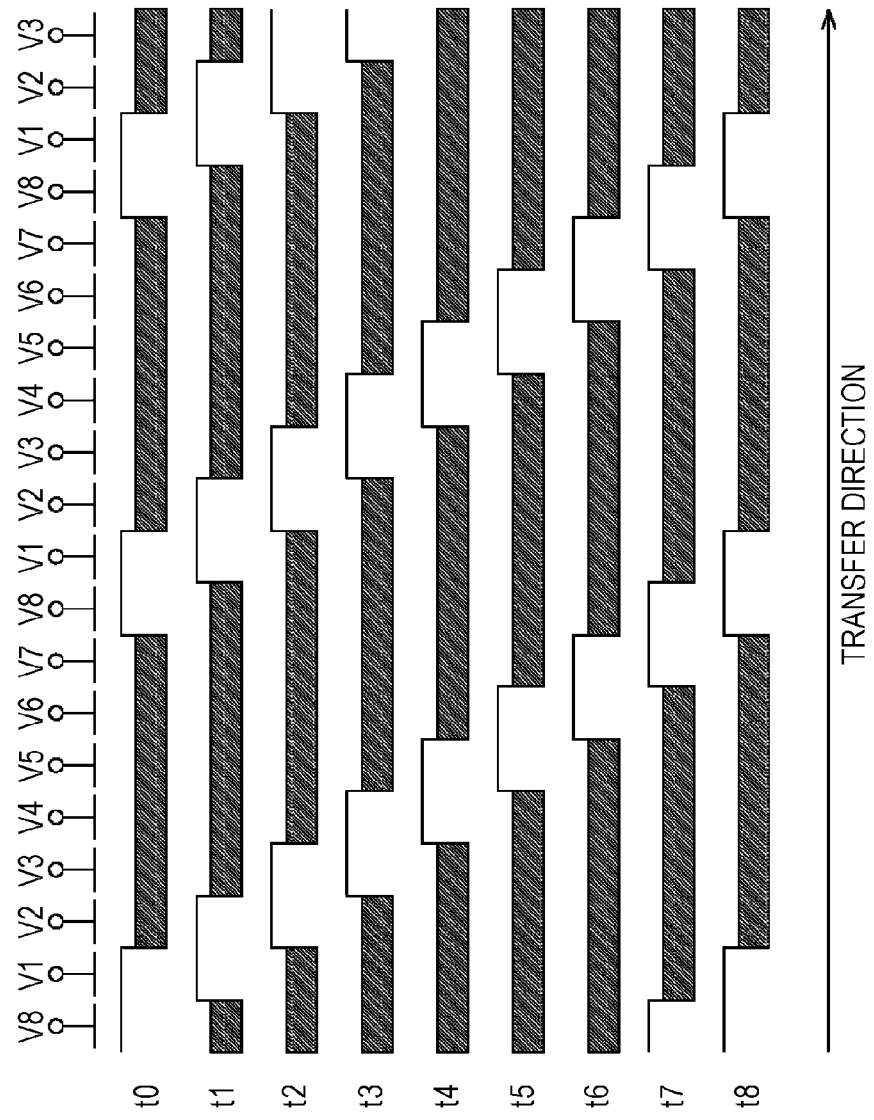
FIG. 6 is a chart showing potentials of transfer electrodes at respective times in FIG. 5.

FIG. 6 is a chart showing potentials of the transfer electrodes at time t0 to time t8 in FIG. 5. Note that the transfer electrodes to which the transfer clock signals φV1 to φV8 are applied are referred to as transfer electrodes V1 to V8, respectively. In FIG. 6, parts shown by thick black horizontal lines represent the potential well, and parts shown as white projections represent potential barriers.

In this manner, the potential distribution of the potential well sequentially changes under the control of the transfer clock signals φV1 to φV8 applied to the transfer electrodes V1 to V8, respectively. The charge in the potential well is thus transferred in the phase shift direction of the transfer clock signals.

Among the transfer electrodes V1 to V8, a transfer electrode to which a transfer clock signal having a standby voltage L is applied will be referred to as a VL electrode and a transfer electrode to which a transfer clock signal having a standby voltage M is applied will be referred to as a VM electrode. In the example shown in FIG. 4, the standby voltages of the transfer clock signals φV1 and φV8 are L. The transfer electrodes V1 and V8 are thus referred to as VL electrodes, and the transfer electrodes V2 to V7 are referred to as VM electrodes.

In the example of FIG. 2, the second transfer electrode 105-2 from the top and the third transfer electrode 105-3 from the top in FIG. 2 are VL electrodes and the other transfer electrodes are VM electrodes.

Note that, in solid-state image sensors such as CCD image sensors, the influence of white lines (white flaws) caused in vertical transfer registers on the image quality is a concern. The white flaws are caused by crystal defects of n-type impurity doped as the vertical transfer registers. Thus, to reduce the influence of the white flaws, it is desirable to reduce the amount of n-type impurity doped as the vertical transfer registers.

The potential of the n-type regions (vertical transfer registers), however, needs to be sufficiently deep correspondingly to the charge amount that can be handled by the vertical transfer registers. Thus, the level of potential corresponding to the charge amount handled by the vertical transfer registers cannot be obtained only by simply reducing the amount of doped n-type impurity.

A method of increasing the widths of the n-type regions (that is, the line widths of the vertical transfer registers) to obtain the potential level corresponding to the handled charge amount, for example, is thus conceivable. The increase in the line widths of the vertical transfer registers allow a sufficient handled charge amount to be ensured even with a shallow potential and the amount of impurity in the vertical transfer registers to be reduced. Furthermore, the increase in the line widths of the vertical transfer registers makes the vertical transfer registers be less likely to be affected by dispersion of impurity from the p-type impurity regions of the adjacent reading units and vertical element isolation units and can reduce the amount of doped n-type impurity required for obtaining a desired potential.

In recent years, however, the pixel size of solid-state image sensor such as CCD image sensors has been becoming smaller and smaller, and it is difficult to change design to further increase the widths of vertical transfer registers in such circumstances. Furthermore, the areas of the light receiving surfaces of sensor units may become smaller correspondingly to the increase in the line widths of vertical transfer registers, and there is a concern about influence of reduction in sensitivity, reduction in saturated signal amount, or the like on the image quality.

Figure 7:
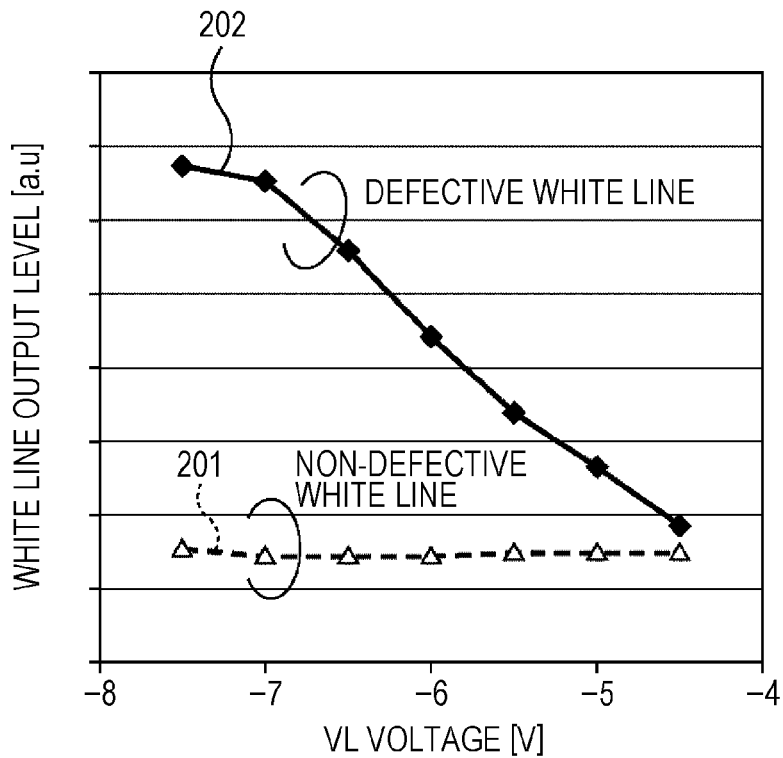
FIG. 7 is a graph showing the relation between a white line and a low-level voltage.

Furthermore, it was shown by experiments that a white line (white flaw) correlates highly with a low-level voltage. FIG. 7 is a graph showing the relation between a white line and a low-level voltage. In FIG. 7, the horizontal axis represents a low-level voltage value, the vertical axis represents a white line output level, and variations in the white line output level with a variation in the low-level voltage are shown by a line 201 and a line 202.

The line 201 shows the variation in the white line output level with the variation in the low-level voltage in the case of a good white line (non-defective white line) that has little influence on the image quality. The line 202 shows the variation in the white line output level with the variation in the low-level voltage in the case of a white line (defective white line) that has influence on the image quality.

As shown by the line 202 in FIG. 7, the white line output level is higher as the low-level voltage value is lower. Thus, the image quality is more degraded by a white flaw as the low-level voltage value is lower. In the case of the line 201, the white line output level is approximately constant independently of the variation in the low-level voltage.

Figure 8:
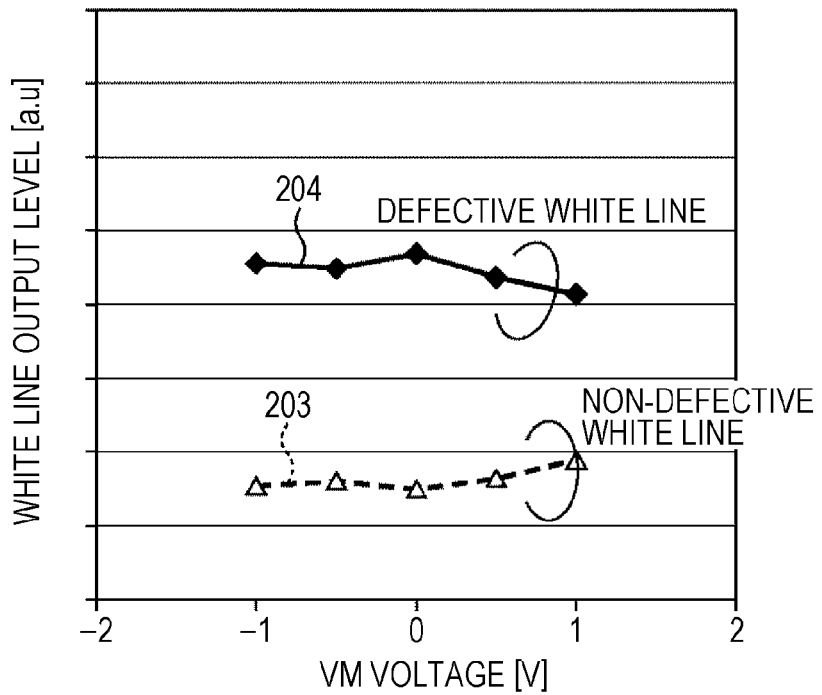
FIG. 8 is a graph showing the relation between a white line and a middle-level voltage.

FIG. 8 is a graph showing the relation between a white line and a middle-level voltage. In FIG. 8, the horizontal axis represents a middle level voltage value, the vertical axis represents a white line output level, and variations in the white line output level with a variation in the middle-level voltage are shown by a line 203 and a line 204.

The line 203 shows the variation in the white line output level with the variation in the middle-level voltage in the case of a good white line (non-defective white line) that has little influence on the image quality. The line 204 shows the variation in the white line output level with the variation in the middle-level voltage in the case of a white line (defective white line) that has influence on the image quality.

Unlike FIG. 7, the white line output level is approximately constant independently of the variation in the middle-level voltage in the cases of the lines 203 and 204.

As can be seen in FIGS. 7 and 8, occurrence of white flaws having influence on the image quality correlates highly with the variation in the low-level voltage. This is considered to be because the filed intensity becomes high when a low-level voltage is applied, which facilitates generation of dark current.

The present technology can reduce the influence of white flaws without preventing the decrease in the pixel size of solid-state image sensors.

Figure 9:
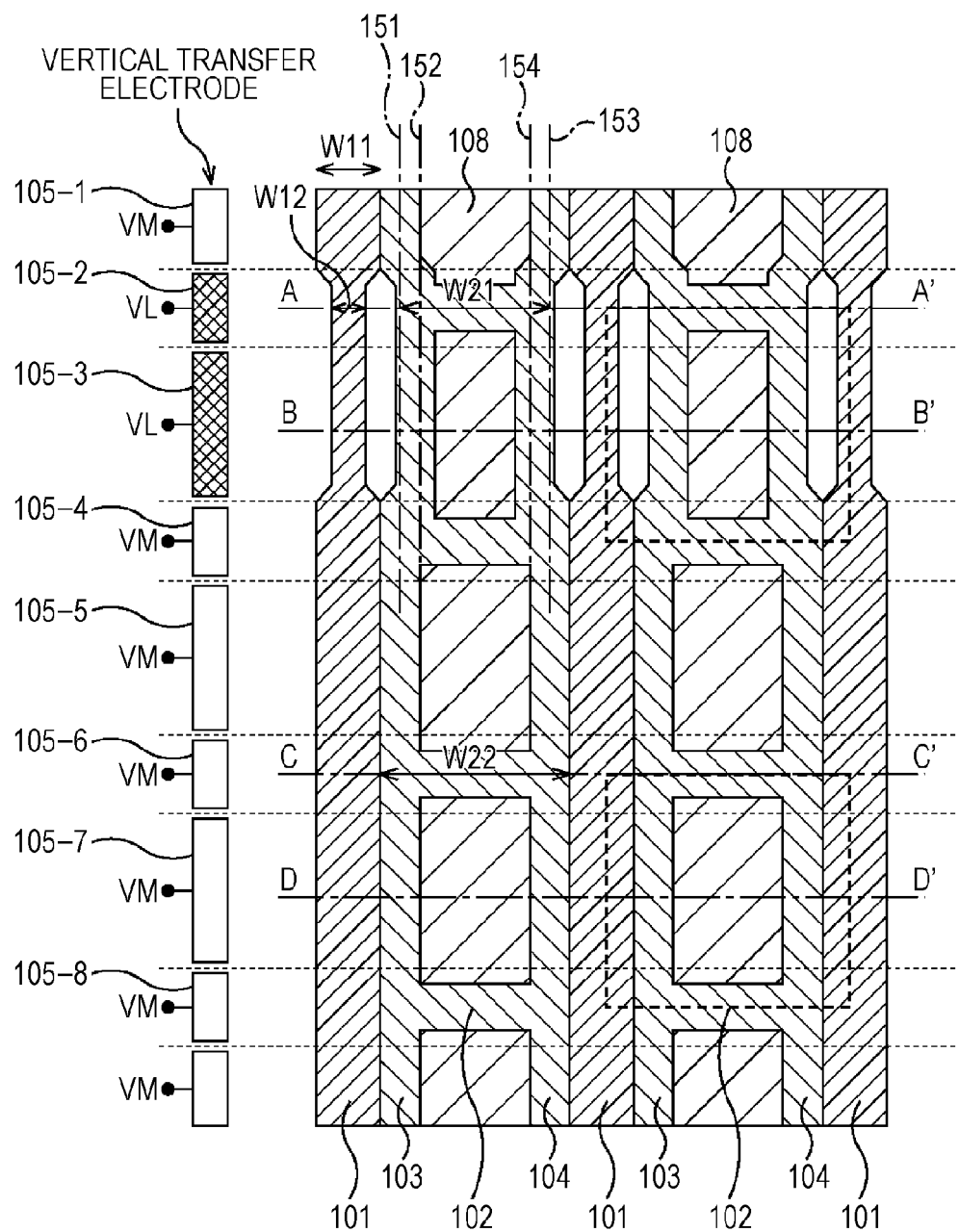
FIG. 9 is a plan view showing an example configuration of an imaging unit according to an embodiment of the present technology.

FIG. 9 is an enlarged view of part of the imaging unit 22 in FIG. 1 in a form of a plan view showing an example configuration of an imaging unit according to an embodiment of the present technology. FIGS. 10A to 10D show cross-sectional views along dashed-dotted lines A-A', B-B', C-C' and D-D' in FIG. 9. FIG. 10A is a cross-sectional view along the dashed-dotted line A-A' in FIG. 2 and FIG. 10B is a cross-sectional view along the dashed-dotted line B-B' in FIG. 9. Furthermore, FIG. 10C is a cross-sectional view along the dashed-dotted line C-C' in FIG. 9 and FIG. 10D is a cross-sectional view along the dashed-dotted line D-D' in FIG. 9.

In fact, FIG. 9 shows a shape of a mask used in a manufacturing process for attaching impurity to the substrate, and the completed configuration of the imaging unit on the substrate varies slightly according to the manufacturing process of the substrate.

In FIG. 9, parts corresponding to those in FIG. 2 are designated by the same reference numerals. Similarly, in FIG. 10, parts corresponding to those in FIGS. 3A and 3B are designated by the same reference numerals.

Figure 3:
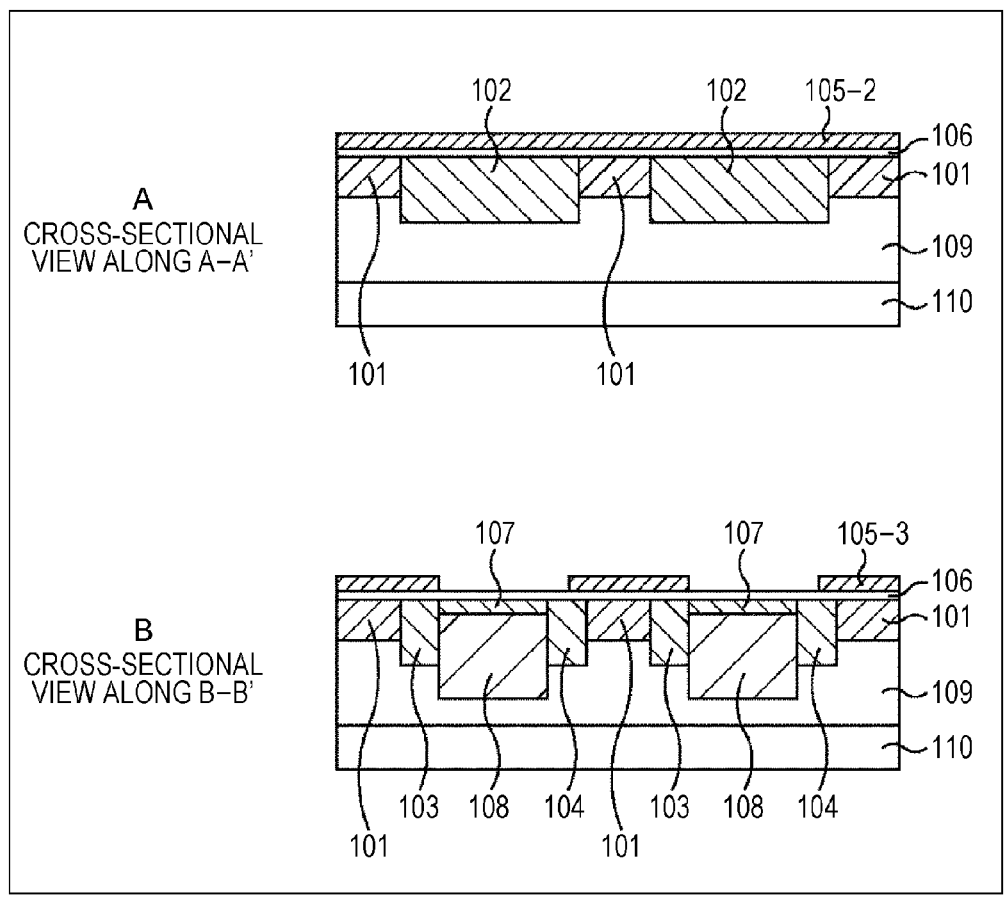
FIGS. 3A and 3B show cross-sectional views along dashed-dotted lines A-A', B-B', C-C' and D-D' in FIG. 2.
Figure 10:
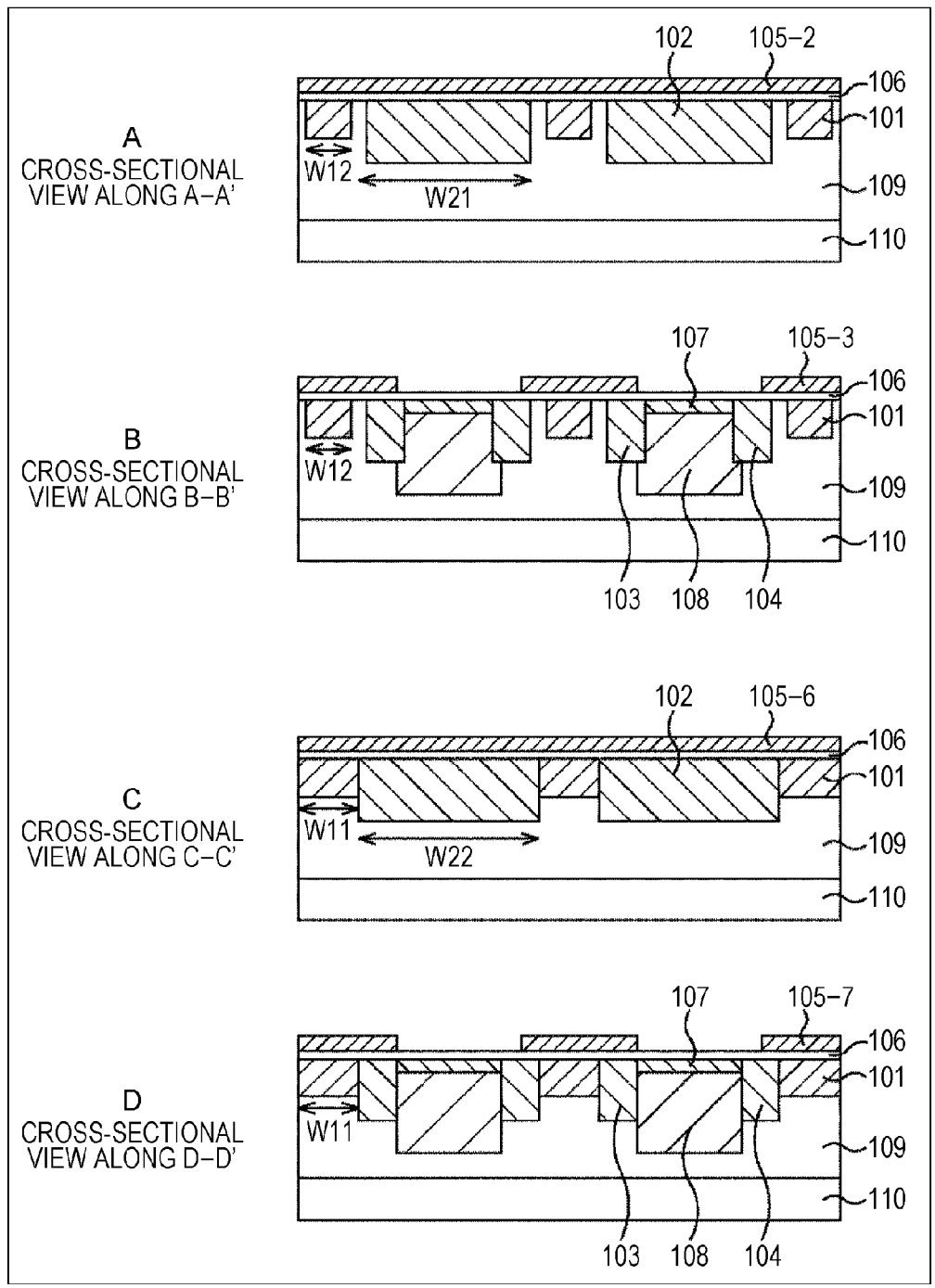
FIGS. 10A to 10D show cross-sectional views along dashed-dotted lines A-A', B-B', C-C' and D-D' in FIG. 9.

In the example of FIGS. 9 and 10, unlike FIGS. 2 and 3, each vertical transfer register 101 has a smaller width below the transfer electrodes 105-2 and 105-3 that are VL electrodes.

For example, in FIG. 9, the width in the horizontal direction of each vertical transfer register 101 has a width W11 at the uppermost portion and the lowermost portion in FIG. 9 but becomes thinner to have a width W12 at a portion at substantially the same position in the vertical direction as the upper end of the transfer electrode 105-2 in FIG. 9. The vertical transfer register 101 extends while maintaining the width W12 and becomes thicker to have the original width W11 at a portion at substantially the same position in the vertical direction as the lower end of the transfer electrode 105-3 in FIG. 9.

In addition, for example, the width W12 in the horizontal direction of the vertical transfer register 101 in FIG. 10A is smaller than the width W11 in the horizontal direction of the vertical transfer register 101 in FIG. 10C. Furthermore, the width W12 in the horizontal direction of the vertical transfer register 101 in FIG. 10B is smaller than the width W11 in the horizontal direction of the vertical transfer register 101 in FIG. 10D. In contrast, the widths (thicknesses) in the vertical direction of the vertical transfer register 101 are all the same in FIGS. 10A to 10D.

Furthermore, in the example of FIGS. 9 and 10, unlike FIGS. 2 and 3, each reading unit 103 and each horizontal element isolation unit 104 are curved toward the center of the sensor unit 108 below the transfer electrodes 105-2 and 105-3 that are VL electrodes.

For example, in FIG. 9, the position in the horizontal direction of the center of the reading unit 103 is the position shown by a dashed-dotted line 151 at the upper end and the lower end thereof in FIG. 9. The center of the reading unit 103, however, curves rightward in FIG. 9 at a portion at substantially the same position in the vertical direction as the upper end of the transfer electrode 105-2 in FIG. 9 and comes to the position shown by a dashed-dotted line 152. The center of the reading unit 103 then extends along the position shown by the dashed-dotted line 152 and curves leftward in FIG. 9 at the portion at substantially the same position in the vertical direction as the lower end of the transfer electrode 105-3 in FIG. 9 back to the original position (the position shown by the dashed-dotted line 151).

In addition, in FIG. 9, the position in the horizontal direction of the center of the horizontal element isolation unit 104 is the position shown by a dashed-dotted line 153 at the upper end and the lower end thereof in FIG. 9, for example. The center of the horizontal element isolation unit 104, however, curves leftward in FIG. 9 at a portion at substantially the same position in the vertical direction as the upper end of the transfer electrode 105-2 in FIG. 9 and comes to the position shown by a dashed-dotted line 154. The center of the horizontal element isolation unit 104 then extends along the position shown by the dashed-dotted line 154 and curves rightward in FIG. 9 at the portion at substantially the same position in the vertical direction as the lower end of the transfer electrode 105-3 in FIG. 9 back to the original position (the position shown by the dashed-dotted line 153).

In addition, for example, the width W21 in the horizontal direction of the vertical element isolation unit 102 in FIG. 10A is smaller than the width W22 in the horizontal direction of the vertical element isolation unit 102 in FIG. 10C. Thus, as described above with reference to FIG. 9, since the reading unit 103 and the horizontal element isolation unit 104 curve toward the center of the sensor unit 108, the width in the horizontal direction in FIG. 9 of the vertical element isolation unit 102 becomes smaller at the position of the dashed-dotted line A-A'.

Furthermore, the position in the horizontal direction of the center of the reading unit 103 in FIG. 10B is shifted rightward from the position in the horizontal direction of the center of the reading unit 103 in FIG. 10D. The position in the horizontal direction of the center of the horizontal element isolation unit 104 in FIG. 10B is shifted leftward from the position in the horizontal direction of the center of the horizontal element isolation unit 104 in FIG. 10D. In contrast, the widths in the horizontal direction of the reading unit 103 and the horizontal element isolation unit 104 are the same in FIGS. 10B and 10D.

Furthermore, as described above, FIG. 9 in fact shows a shape of a mask used in a manufacturing process for attaching impurity to the substrate, and the configuration of the imaging unit on the completed substrate varies slightly according to the manufacturing process of the substrate. Thus, in the process of manufacturing the substrate, the n-type impurity forming the vertical transfer registers 101 and the p-type impurity forming the reading units 103, the vertical element isolation units 102, and the horizontal element isolation units 104 disperse. The cross-sectional views shown in FIGS. 10A to 10D are drawn regardless of the impurity dispersion in the manufacturing process for simplicity, and the cross-sectional views of the completed imaging unit on the substrate taking the impurity dispersion into consideration are slightly different from those shown in FIG. 10.

FIGS. 11A and 11B show cross-sectional views for explaining the configuration of an imaging unit on a completed substrate taking impurity dispersion in the manufacturing process into consideration. FIG. 11A is a cross-sectional view along the dashed-dotted line B-B' in FIG. 9 and corresponds to FIG. 10B. FIG. 11B is a cross-sectional view along the dashed-dotted line D-D' in FIG. 9 and corresponds to FIG. 10D.

While each vertical transfer register 101 and each reading unit 103 are drawn as being arranged separately from each other in FIGS. 10B and 10D, each vertical transfer register 101 and each reading unit 103 are drawn as being in contact with each other in FIGS. 11A and 11B. Furthermore, while each vertical transfer register 101 and each horizontal element isolation unit 104 are drawn as being arranged separately from each other in FIGS. 10B and 10D, each vertical transfer register 101 and each horizontal element isolation unit 104 are drawn as being in contact with each other in FIGS. 11A and 11B.

Thus, as a result of impurity dispersion in the manufacturing process, the n-type impurity regions (vertical transfer registers 101) and the p-type impurity regions (reading units 103 and horizontal element isolation units 104) have dispersed. When impurity is attached by using the mask as shown in FIG. 9, however, the concentration of n-type impurity is high at the center of the line of each vertical transfer register 101 and becomes lower toward both ends thereof, for example. Furthermore, the concentration of p-type impurity is high at the center of the line of each reading unit 103 or each horizontal element isolation unit 104 and becomes lower toward both ends thereof.

Figure 11:
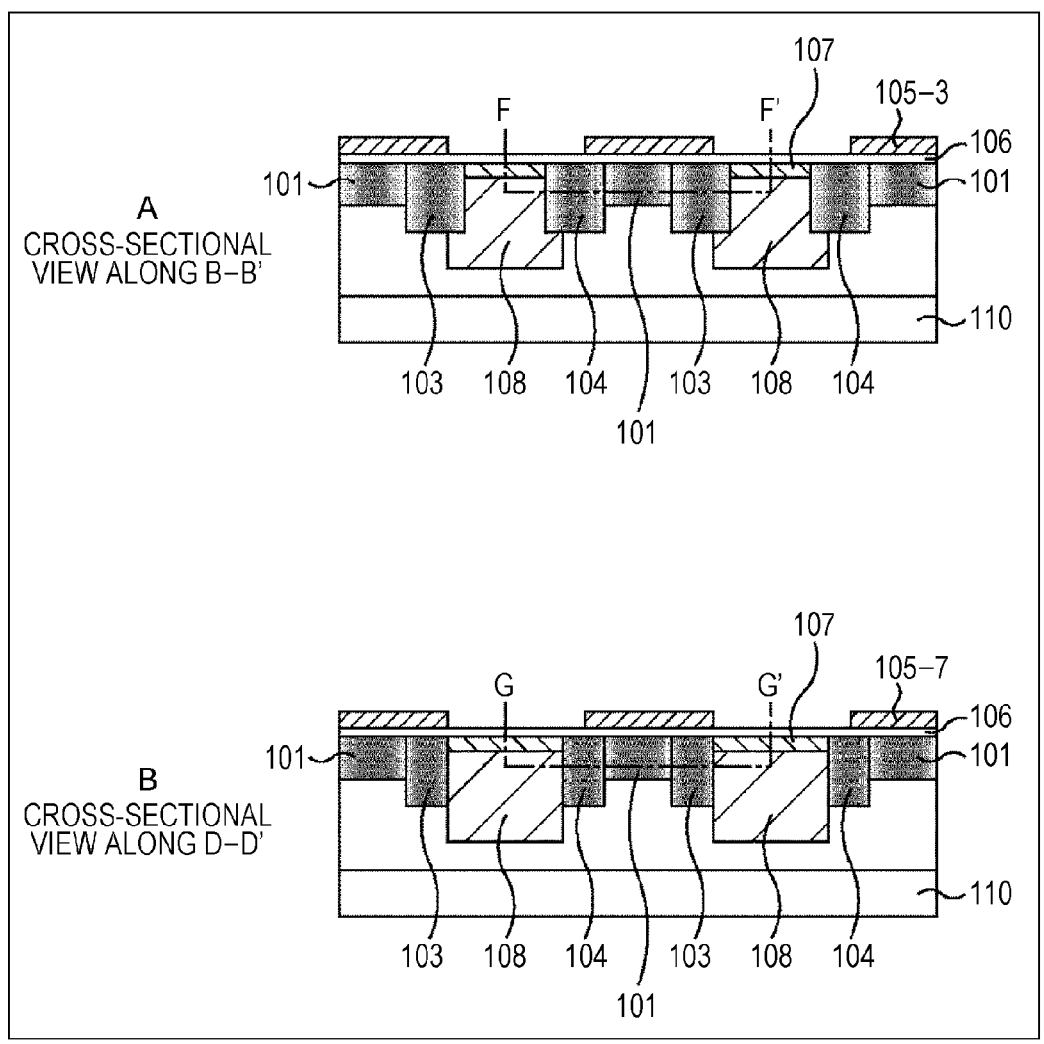
FIGS. 11A and 11B show cross-sectional views for explaining the configuration of an imaging unit on a completed substrate.

In FIG. 11, the state in which the concentration of n-type impurity is high at the center of the line of the vertical transfer register 101 and becomes lower toward both ends thereof is expressed by a gradation. Similarly, the state in which the concentration of p-type impurity is high at the center of the line of the reading unit 103 or the horizontal element isolation unit 104 and becomes lower toward both ends thereof is expressed by a gradation.

Figure 12:
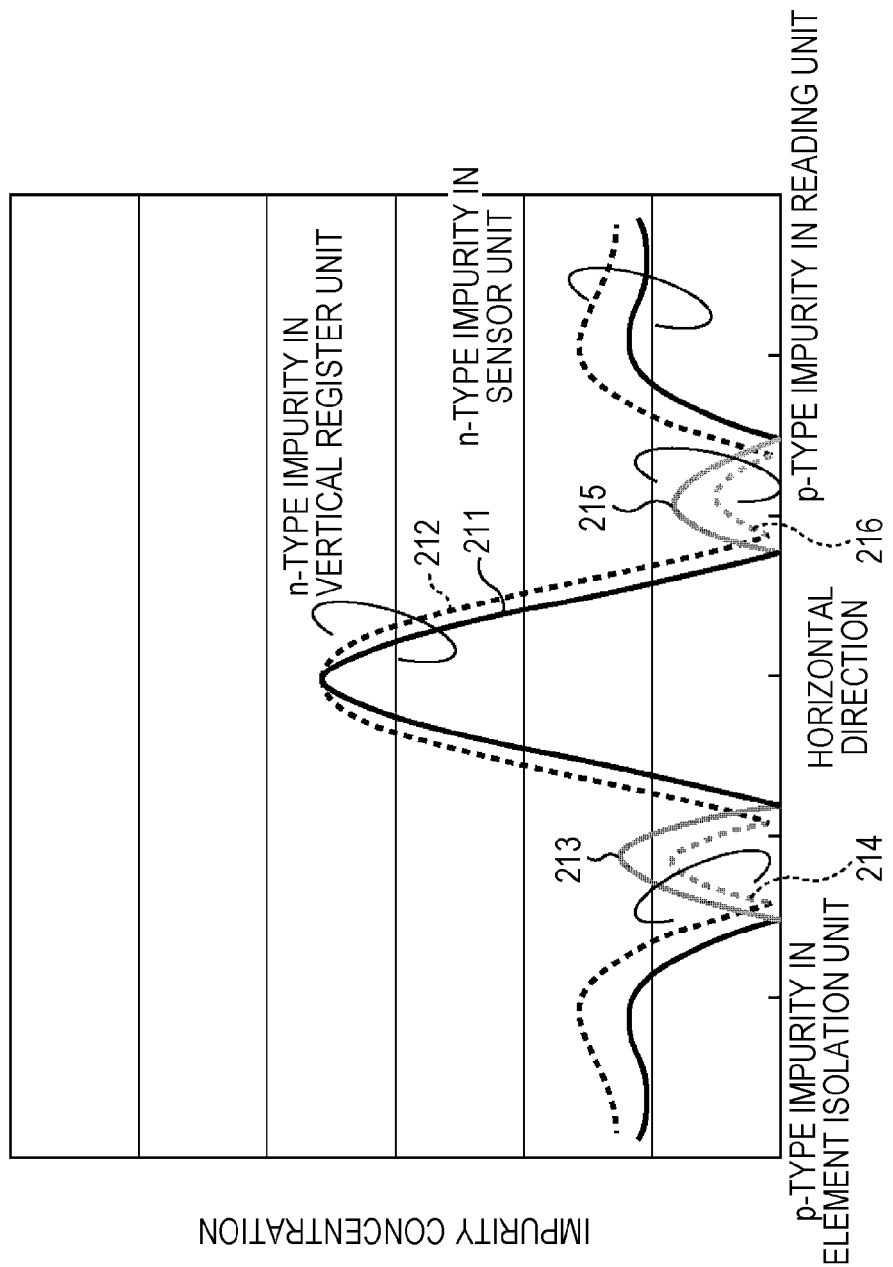
FIG. 12 is a graph for explaining variation in impurity concentration.

FIG. 12 is a graph explaining variation in the impurity concentration described above. In FIG. 12, the horizontal axis represents the position in the horizontal direction in FIGS. 11A and 11B and the vertical axis represents the impurity concentration.

In FIG. 12, a solid line 211 represents variation in the concentration of n-type impurity at a dashed-dotted line F-F' in FIG. 11A, and a dotted line 212 represents variation in the concentration of n-type impurity at a dashed-dotted line G-G' in FIG. 11B.

The solid line 211 changes more sharply than the dotted line 212. Specifically, the solid line 211 and the dotted line 212 both form peaks at the center in FIG. 12 and incline leftward and rightward therefrom, and the inclination of the solid line 211 is sharper.

Note that the concentration of n-type impurity around the center in FIG. 12 represents the concentration of n-type impurity of the vertical transfer register 101, and the concentrations of n-type impurity around the left and right ends in FIG. 12 represent the concentrations of n-type impurity of the sensor units 108.

Furthermore, in FIG. 12, a solid line 213 represents variation in the concentration of p-type impurity at the dashed-dotted line F-F' in FIG. 11A, and a dotted line 214 represents variation in the concentration of p-type impurity at the dashed-dotted line G-G' in FIG. 11B. Note that the solid line 213 and the dotted line 214 represent the concentrations of p-type impurity of the horizontal element isolation unit 104.

The solid line 213 changes more sharply than the dotted line 214. Specifically, the solid line 213 and the dotted line 214 both form peaks at a point on the left side in FIG. 12 and incline gently leftward and rightward therefrom, and the inclination of the solid line 213 is sharper.

Furthermore, in FIG. 12, a solid line 215 represents variation in the concentration of p-type impurity at the dashed-dotted line F-F' in FIG. 11A, and a dotted line 216 represents variation in the concentration of p-type impurity at the dashed-dotted line G-G' in FIG. 11B. Note that the solid line 215 and the dotted line 216 represent the concentrations of p-type impurity of the reading unit 103.

The solid line 215 changes more sharply than the dotted line 216. Specifically, the solid line 215 and the dotted line 216 both form peaks at a point on the right side in FIG. 12 and incline gently leftward and rightward therefrom, and the inclination of the solid line 215 is sharper.

With the configuration of the imaging unit 22 as described above with reference to FIGS. 9 to 11, the influence of white flaws can be reduced without preventing the decrease in the pixel size of solid-state image sensors.

Specifically, according to the present technology, the line widths of the vertical transfer registers are made smaller below the VL electrodes where occurrence of white flaws having influence on the image quality is significant. As a result, the amount of doped n-type impurity below VL electrodes is reduced and the amount of n-type impurity per unit area becomes smaller below the VL electrodes on the completed substrate, which can suppress occurrence of white flaws having influence on the image quality. Thus, the total amount of n-type impurity below the VL electrodes is reduced.

At the same time, with the present technology, the centers of the lines of the reading units 103 and the horizontal element isolation units 104 are farther from the vertical transfer registers below the VL electrodes. As a result, the vertical transfer registers 101 become less likely to be influenced by dispersion of p-type impurity of the adjacent reading units 103 and horizontal element isolation units 104, and the potential can be made sufficiently deep even with the reduced amount of doped n-type impurity. Thus, a desired potential can be obtained even when the line widths of the vertical transfer registers 101 are reduced.

Furthermore, according to the present technology, some of the areas of the light receiving surfaces of the sensor units 108 are reduced as a result of arranging the centers of the lines of the reading units 103 and the horizontal element isolation units 104 farther from the vertical transfer registers. The areas of the light receiving surfaces, however, are only reduced at the sensor units 108 arranged below the VL electrodes, and the areas of the light receiving surfaces of the other sensor units are not changed. Thus, the influence of reduction in sensitivity, reduction in saturated signal amount, or the like on the image quality is very limited.

Figure 13:
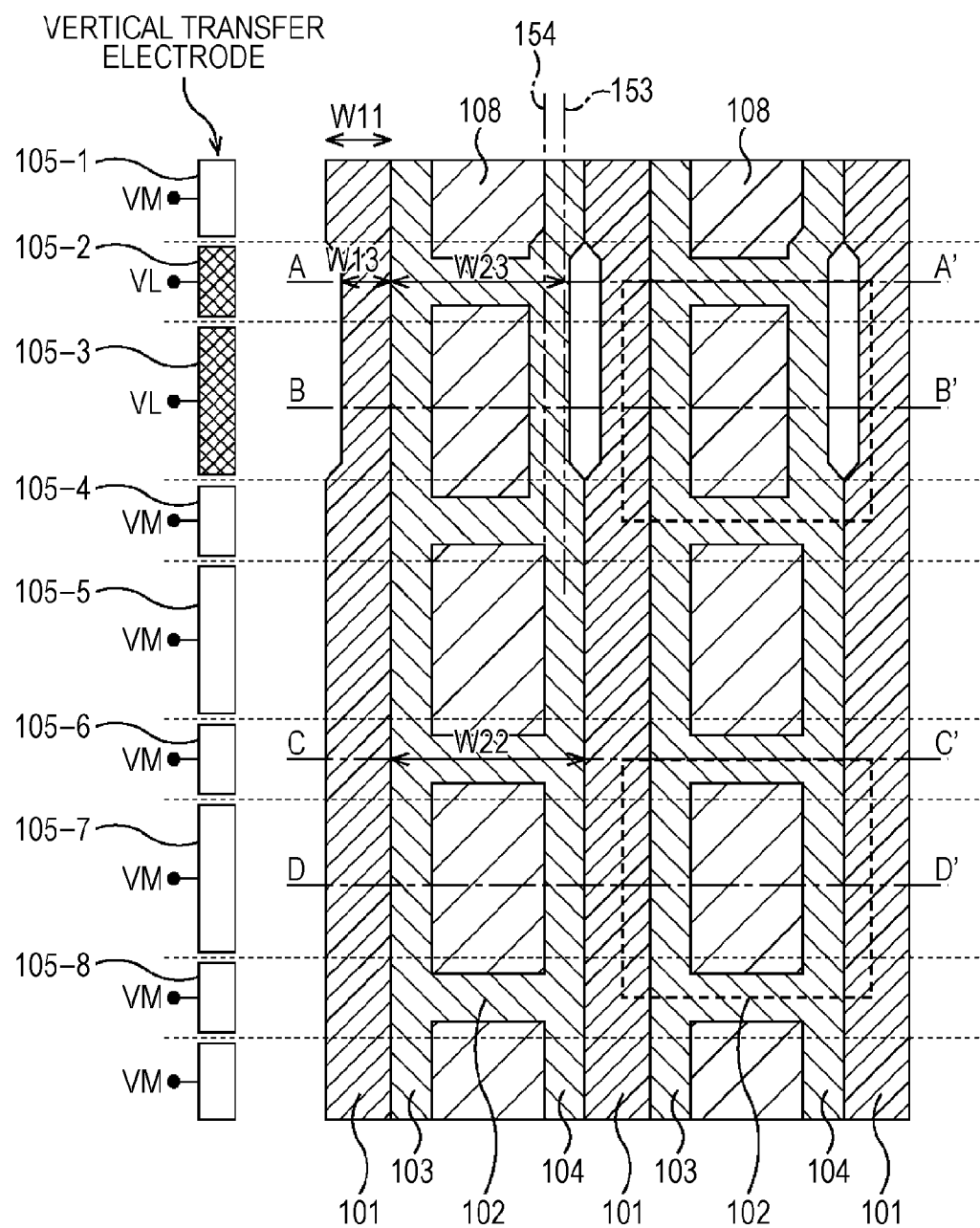
FIG. 13 is a plan view showing an example configuration of an imaging unit according to another embodiment of the present technology.

FIG. 13 is an enlarged view of part of the imaging unit 22 in FIG. 1 in a form of a plan view showing an example configuration of an imaging unit according to another embodiment of the present technology. FIGS. 14A to 14D show cross-sectional views along dashed-dotted lines A-A', B-B', C-C' and D-D' in FIG. 13. FIG. 14A is a cross-sectional view along the dashed-dotted line A-A' in FIG. 13 and FIG. 14B is a cross-sectional view along the dashed-dotted line B-B' in FIG. 13. Furthermore, FIG. 14C is a cross-sectional view along the dashed-dotted line C-C' in FIG. 13 and FIG. 14D is a cross-sectional view along the dashed-dotted line D-D' in FIG. 13.

In fact, FIGS. 14A to 14D show a shape of a mask used in a manufacturing process for attaching impurity to the substrate, and the configuration of the imaging unit on a completed substrate varies slightly according to the manufacturing process of the substrate.

In FIG. 13, parts corresponding to those in FIG. 9 are designated by the same reference numerals. Similarly, in FIG. 14, parts corresponding to those in FIGS. 10A to 10D are designated by the same reference numerals.

In the configuration shown in FIGS. 13 and 14, unlike the configuration described above with reference to FIGS. 9 and 10, the vertical transfer register 101 has a smaller line width in such a shape that only the left side thereof is cut off below the transfer electrodes 105-2 and 105-3 that are VL electrodes.

For example, in FIG. 13, the width in the horizontal direction of the vertical transfer register 101 has a width W11 at the uppermost portion and the lowermost portion in FIG. 13 but becomes thinner only at the left side thereof to have a width W13 at a portion at substantially the same position in the vertical direction as the upper end of the transfer electrode 105-2 in FIG. 13. The vertical transfer register 101 then extends while maintaining the width W13 and becomes thicker to have the original width W11 at a portion at substantially the same position in the vertical direction as the lower end of the transfer electrode 105-3 in FIG. 13.

In addition, for example, the width W13 in the horizontal direction of the vertical transfer register 101 in FIG. 14A is smaller than the width W11 in the horizontal direction of the vertical transfer register 101 in FIG. 14C. Furthermore, the width W13 in the horizontal direction of the vertical transfer register 101 in FIG. 14B is smaller than the width W11 in the horizontal direction of the vertical transfer register 101 in FIG. 14D. In contrast, the widths (thicknesses) in the vertical direction of the vertical transfer register 101 are all the same in FIGS. 14A to 14D.

Furthermore, in the example of FIGS. 13 and 14, unlike the example of FIGS. 9 and 10, only the horizontal element isolation unit 104 is curved toward the center of the sensor unit 108 below the transfer electrodes 105-2 and 105-3 that are VL electrodes.

For example, in FIG. 13, the position in the horizontal direction of the center of the horizontal element isolation unit 104 is the position shown by a dashed-dotted line 153 at the upper end and the lower end thereof in FIG. 13. The center of the horizontal element isolation unit 104, however, curves leftward in FIG. 13 at a portion at substantially the same position in the vertical direction as the upper end of the transfer electrode 105-2 in FIG. 13 and comes to the position shown by a dashed-dotted line 154. The center of the horizontal element isolation unit 104 then extends along the position shown by the dashed-dotted line 154 and curves rightward in FIG. 13 at the portion at substantially the same position in the vertical direction as the lower end of the transfer electrode 105-3 in FIG. 13 back to the original position (the position shown by the dashed-dotted line 153).

In addition, for example, the width W23 in the horizontal direction of the vertical element isolation unit 102 in FIG. 14A is smaller than the width W22 in the horizontal direction of the vertical element isolation unit 102 in FIG. 14C. Thus, as described above with reference to FIG. 13, since the horizontal element isolation unit 104 curves toward the center of the sensor unit 108, the width in the horizontal direction in FIG. 13 of the vertical element isolation unit 102 becomes smaller at the position of the dashed-dotted line A-A'.

Furthermore, the position in the horizontal direction of the center of the horizontal element isolation unit 104 in FIG. 14B is shifted leftward from the position in the horizontal direction of the center of the horizontal element isolation unit 104 in FIG. 14D. In contrast, the widths in the horizontal direction of the reading unit 103 and the horizontal element isolation unit 104 are the same in FIGS. 14B and 14D.

Furthermore, as described above, FIG. 13 in fact shows a shape of a mask used in a manufacturing process for attaching impurity to the substrate, and the configuration of the imaging unit on the completed substrate varies slightly according to the manufacturing process of the substrate. Thus, in the process of manufacturing the substrate, the n-type impurity forming the vertical transfer registers 101 and the p-type impurity forming the reading units 103, the vertical element isolation units 102, and the horizontal element isolation units 104 disperse. The cross-sectional views shown in FIGS. 14A to 14D are drawn regardless of the impurity dispersion in the manufacturing process for simplicity, and the cross-sectional views of the completed imaging unit on the substrate taking the impurity dispersion into consideration are slightly different from those shown in FIG. 14.

Specifically, similarly to the case described above with reference to FIGS. 11, 12, etc., the vertical transfer registers 101 and the horizontal element isolation units 104 are arranged in contact with one another while the concentration of n-type impurity and the concentration of p-type impurity are varied on the completed substrate.

With the configuration of the imaging unit 22 as described above with reference to FIGS. 13 to 14, the influence of white flaws can still be reduced without preventing the decrease in the pixel size of solid-state image sensors.

Specifically, with the configuration of FIGS. 13 and 14, the line widths of the vertical transfer registers are made smaller below the VL electrodes where occurrence of white flaws having influence on the image quality is significant. As a result, the amount of doped n-type impurity below the VL electrodes is reduced and the amount of n-type impurity per unit area becomes smaller below the VL electrodes on the completed substrate, which can suppress occurrence of white flaws having influence on the image quality. Thus, the total amount of n-type impurity below the VL electrodes is reduced.

At the same time, the centers of the lines of the horizontal element isolation units 104 are farther from the vertical transfer registers below the VL electrodes. As a result, the vertical transfer registers 101 become less likely to be influenced by dispersion of p-type impurity of the adjacent horizontal element isolation units 104, and the potential can be made sufficiently deep even with the reduced amount of doped n-type impurity. Thus, a desired potential can be obtained even when the line widths of the vertical transfer registers 101 are reduced.

Figure 14:
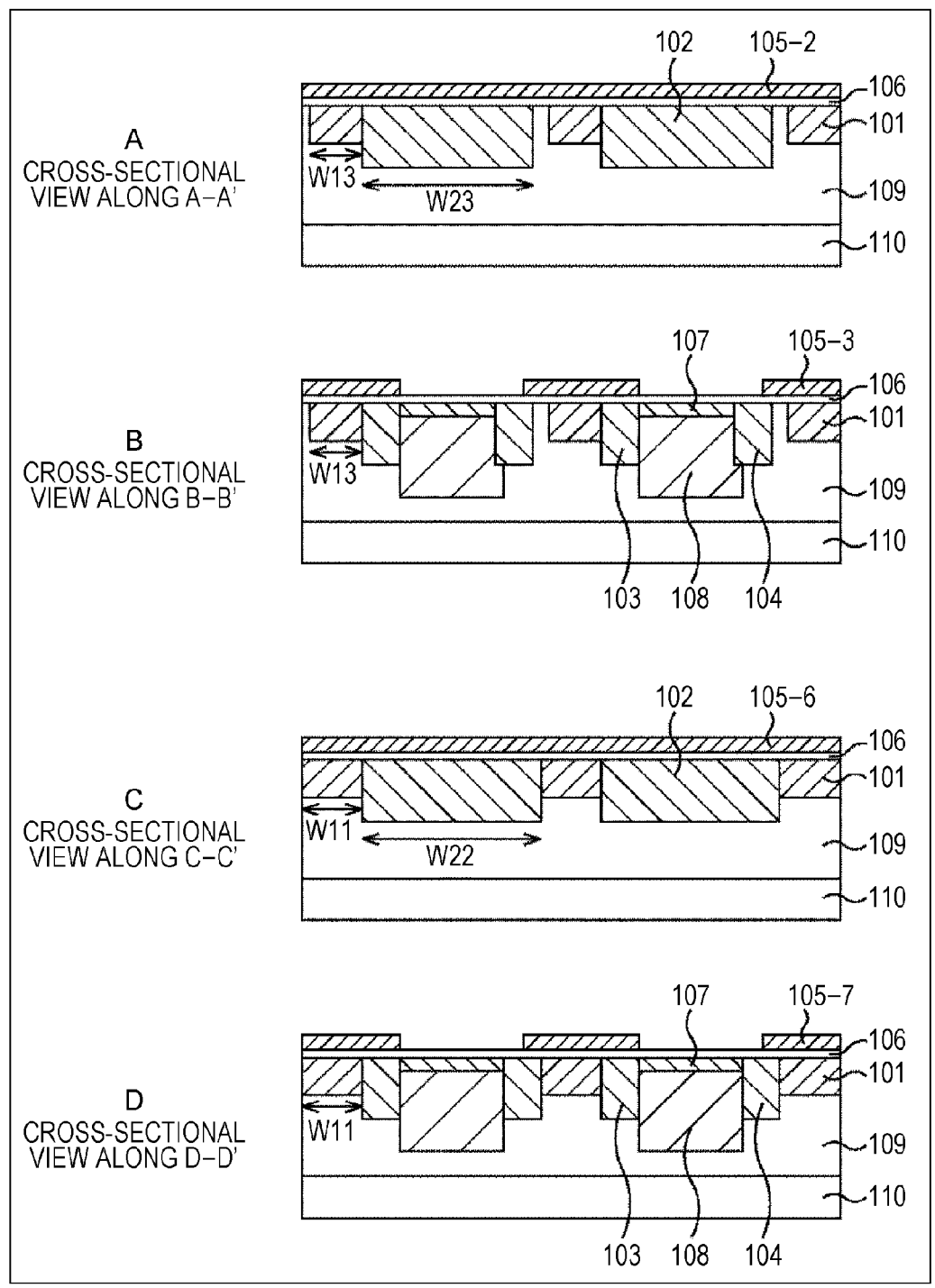
FIGS. 14A to 14D show cross-sectional views along dashed-dotted lines A-A', B-B', C-C' and D-D' in FIG. 13.

The line widths W13 of the vertical transfer registers 101 under the VL electrodes in the configuration of FIGS. 13 and 14, however, are larger than the line widths W12 of the vertical transfer registers 101 under the VL electrodes in the configuration of FIGS. 9 and 10. Thus, as compared to the configuration of FIGS. 9 and 10, the amount of doped n-type impurity is slightly increased and the effect of suppressing occurrence of white flaws having influence on the image quality is slightly reduced in the configuration of FIGS. 13 and 14.

In contrast, as compared to the configuration of FIGS. 9 and 10, the amount by which the areas of the light receiving surfaces of the sensor units 108 below the VL electrodes are reduced is smaller in the configuration of FIGS. 13 and 14. Thus, the influence of reduction in sensitivity, reduction in saturated signal amount, or the like on the image quality is further limited.

In FIGS. 13 and 14, an example in which each vertical transfer register 101 has a smaller line width in such a shape that only the left side thereof is cut off and only each horizontal element isolation unit 104 curves toward the center of the sensor unit 108 has been explained.

However, each vertical transfer register 101 may have a smaller line width in such a shape that only the right side thereof in FIGS. 13 and 14 is cut off and only each reading unit 103 may curve toward the center of the sensor unit 108. A configuration in this case is shown in FIGS. 15 and 16.

Figure 15:
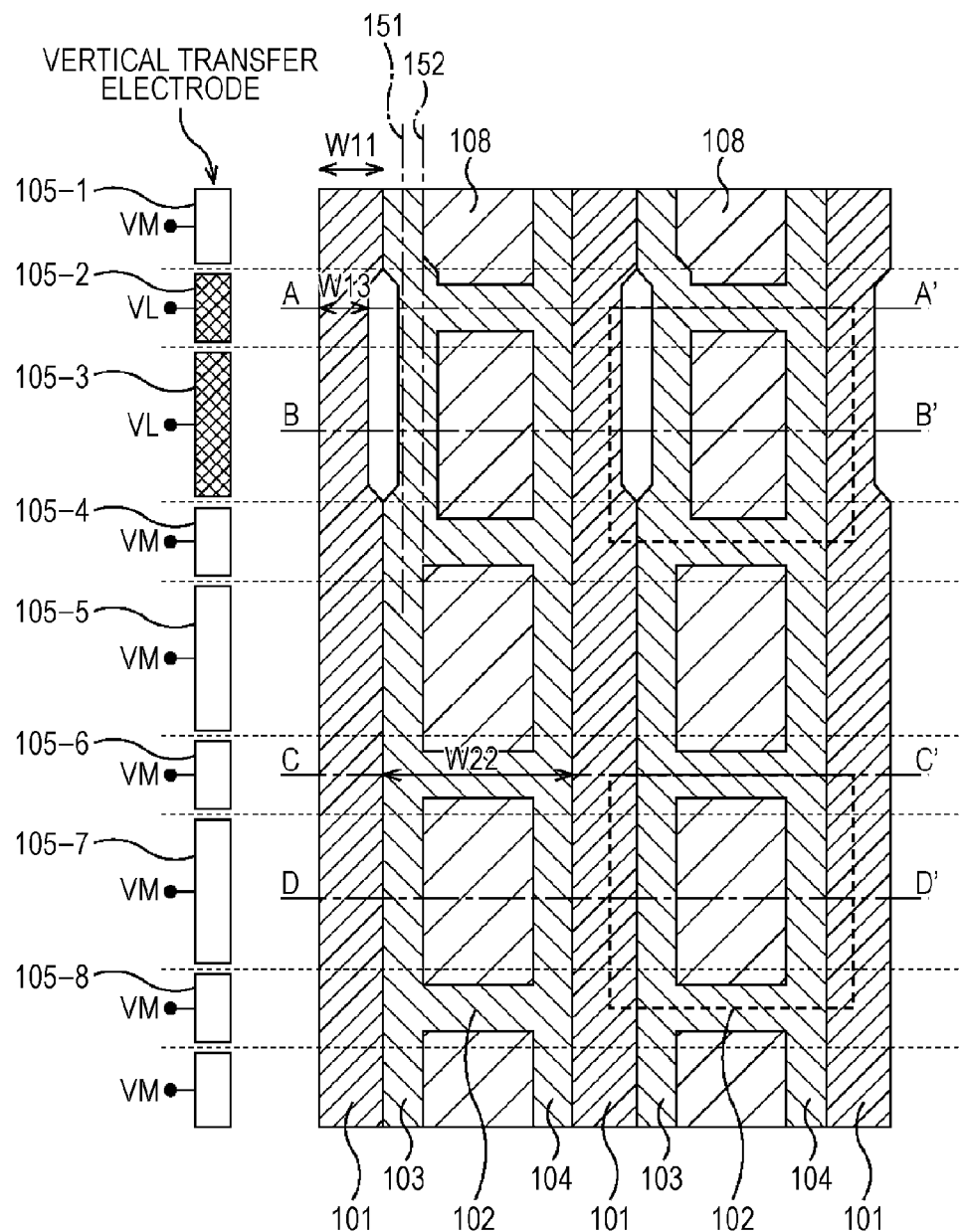
FIG. 15 is a plan view showing an example configuration of an imaging unit according to still another embodiment of the present technology.
Figure 16:
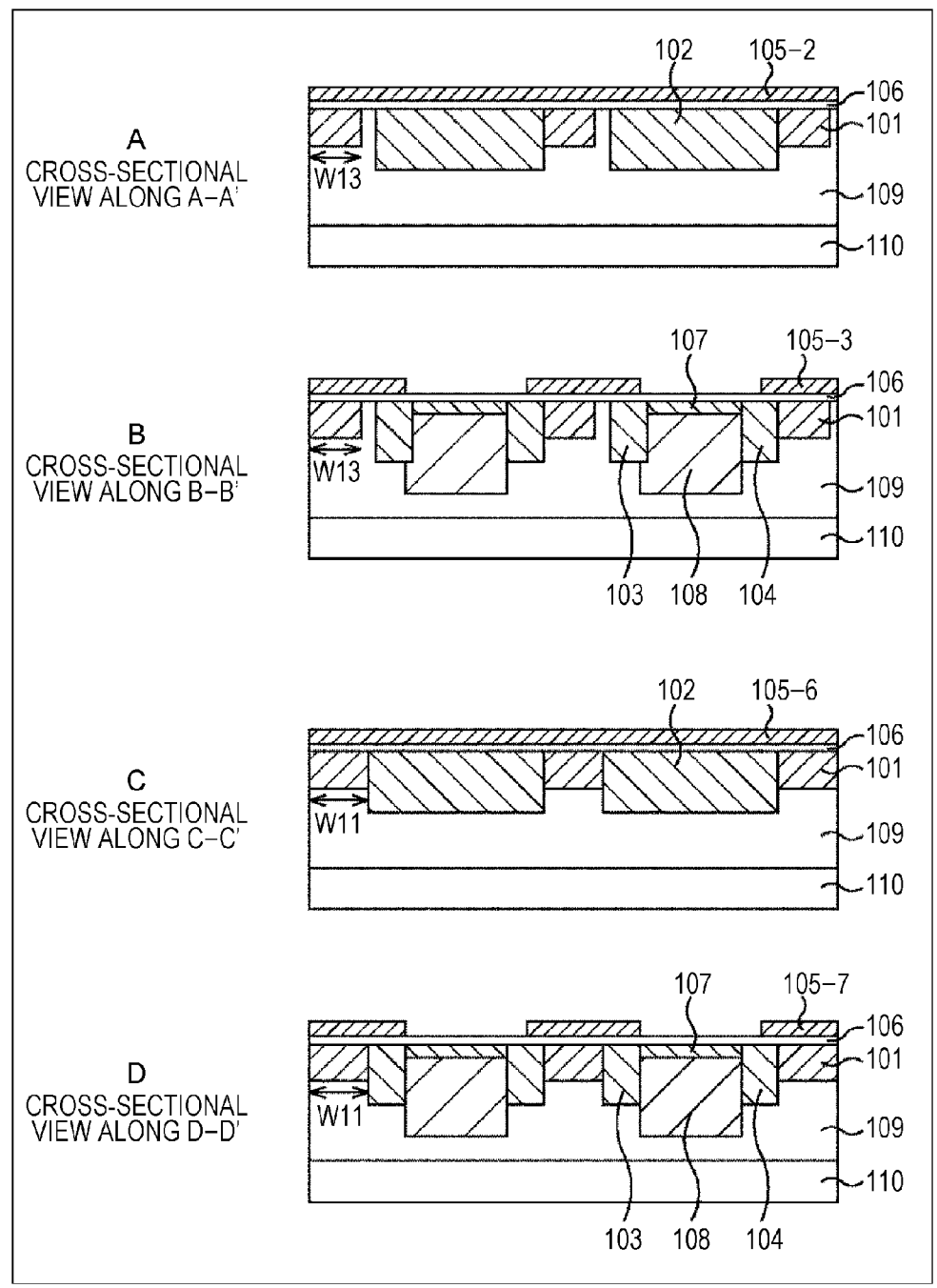
FIGS. 16A to 16D show cross-sectional views along dashed-dotted lines A-A', B-B', C-C' and D-D' in FIG. 15.

FIG. 15 is an enlarged view of part of the imaging unit 22 in FIG. 1 in a form of a plan view showing an example configuration of an imaging unit according to another embodiment of the present technology. FIGS. 16A to 16D show cross-sectional views along dashed-dotted lines A-A', B-B', C-C' and D-D' in FIG. 15. FIG. 16A is a cross-sectional view along the dashed-dotted line A-A' in FIG. 15 and FIG. 16B is a cross-sectional view along the dashed-dotted line B-B' in FIG. 15. Furthermore, FIG. 16C is a cross-sectional view along the dashed-dotted line C-C' in FIG. 15 and FIG. 16D is a cross-sectional view along the dashed-dotted line D-D' in FIG. 15.

In fact, FIG. 15 shows a shape of a mask used in a manufacturing process for attaching impurity to the substrate, and the configuration of the imaging unit on a completed substrate varies slightly according to the manufacturing process of the substrate. Specifically, similarly to the case described above with reference to FIGS. 11, 12, etc., the vertical transfer registers 101 and the reading units 103 are arranged in contact with one another while the concentration of n-type impurity and the concentration of p-type impurity are varied on the completed substrate.

As described above, in the configuration shown in FIGS. 15 and 16, each vertical transfer register 101 has a smaller line width in such a shape that only the right side thereof in FIGS. 15 and 16 is cut off and only each reading unit 103 curves toward the center of the sensor unit 108. As a result, the same effects as those of the configuration of FIGS. 13 and 14 can still be produced.

In the example described above with reference to FIGS. 9 and 10, an example in which each vertical transfer register has a smaller line width and the centers of the lines of each reading unit 103 and each horizontal element isolation unit 104 are arranged farther from the vertical transfer register below VL electrodes has been described. In this case, however, the areas of the light receiving surfaces of the sensor unit 108 below the VL electrodes are reduced as described above.

For example, if each vertical transfer register has a smaller line width and each reading unit 103 and each horizontal element isolation unit 104 also have smaller line widths below the VL electrodes, the areas of the light receiving surfaces of the sensor units 108 can be maintained. A configuration in this case is shown in FIGS. 17 and 18.

Figure 17:
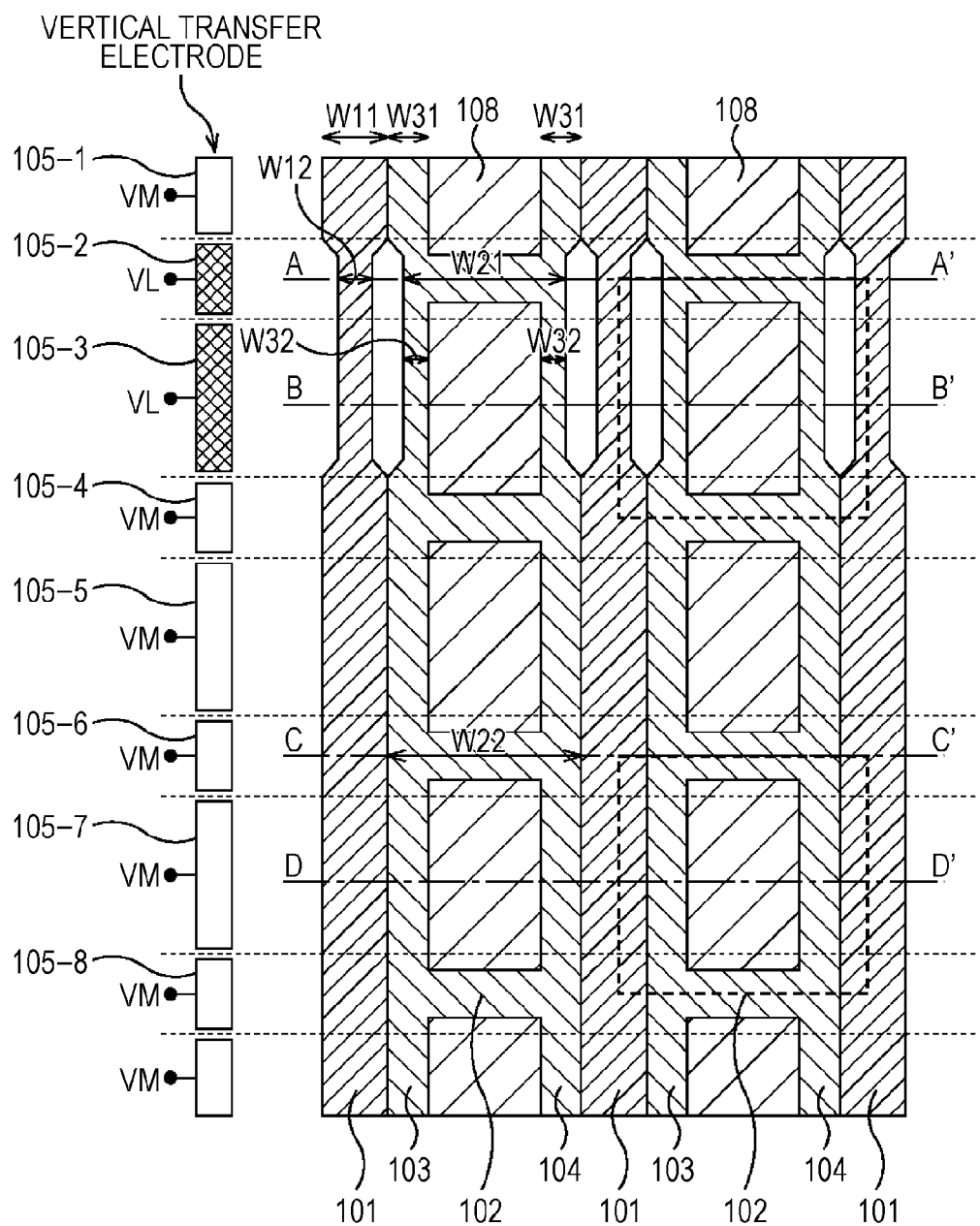
FIG. 17 is a plan view showing an example configuration of an imaging unit according to still another embodiment of the present technology.
Figure 18:
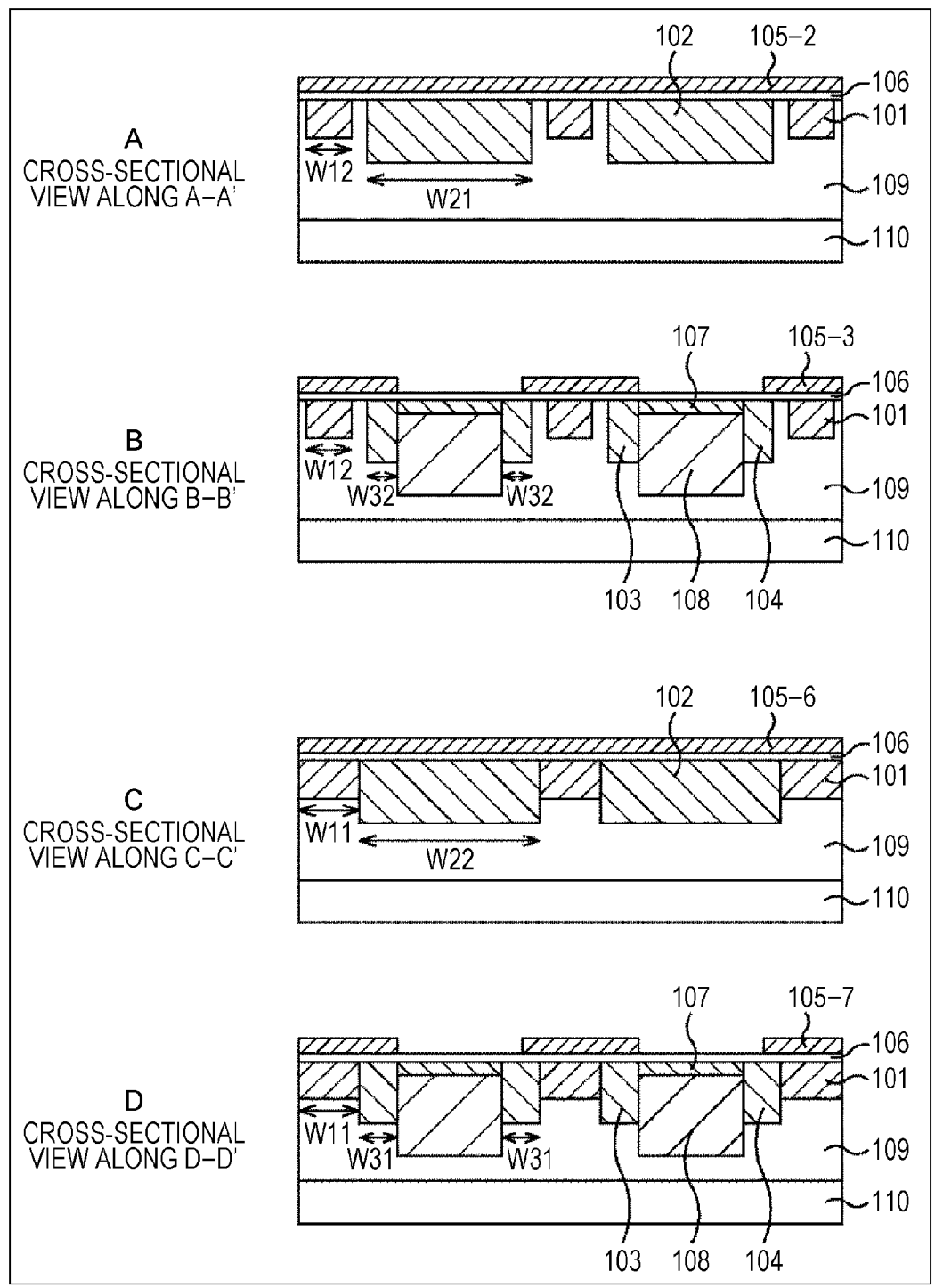
FIGS. 18A to 18D show cross-sectional views along dashed-dotted lines A-A', B-B', C-C' and D-D' in FIG. 17.

FIG. 17 is an enlarged view of part of the imaging unit 22 in FIG. 1 in a form of a plan view showing an example configuration of an imaging unit according to still another embodiment of the present technology. FIGS. 18A to 18D show cross-sectional views along dashed-dotted lines A-A', B-B', C-C' and D-D' in FIG. 17. FIG. 18A is a cross-sectional view along the dashed-dotted line A-A' in FIG. 17 and FIG. 18B is a cross-sectional view along the dashed-dotted line B-B' in FIG. 17. Furthermore, FIG. 18C is a cross-sectional view along the dashed-dotted line C-C' in FIG. 17 and FIG. 18D is a cross-sectional view along the dashed-dotted line D-D' in FIG. 17.

In fact, FIG. 17 shows a shape of a mask used in a manufacturing process for attaching impurity to the substrate, and the configuration of the imaging unit on a completed substrate varies slightly according to the manufacturing process of the substrate. Specifically, similarly to the case described above with reference to FIGS. 11, 12, etc., each vertical transfer register 101 is arranged in contact with both of a reading unit 103 and a horizontal element isolation unit 104 while the concentration of n-type impurity and the concentration of p-type impurity are varied on the completed substrate.

In FIG. 17, parts corresponding to those in FIG. 9 are designated by the same reference numerals. Similarly, in FIG. 18, parts corresponding to those in FIGS. 10A to 10D are designated by the same reference numerals.

In the configuration of FIGS. 17 and 18, similarly to the case of FIGS. 9 and 10, each vertical transfer register 101 has a smaller width below the transfer electrodes 105-2 and 105-3 that are VL electrodes.

Furthermore, in the configuration of FIGS. 17 and 18, unlike the case of FIGS. 9 and 10, each reading unit 103 and each horizontal element isolation unit 104 have smaller widths below the transfer electrodes 105-2 and 105-3 that are VL electrodes.

For example, in FIG. 17, the width in the horizontal direction of the reading unit 103 has a width W31 at the uppermost portion and the lowermost portion in FIG. 17 but becomes thinner only at the left side thereof to have a width W32 at a portion at substantially the same position in the vertical direction as the upper end of the transfer electrode 105-2 in FIG. 17. The reading unit 103 then extends while maintaining the width W32 and becomes thicker to have the original width W31 at a portion at substantially the same position in the vertical direction as the lower end of the transfer electrode 105-3 in FIG. 17.

In addition, for example, the width W32 in the horizontal direction of the reading unit 103 in FIG. 18B is smaller than the width W31 in the horizontal direction of the reading unit 103 in FIG. 18D. In contrast, the widths (thicknesses) in the vertical direction of the reading unit 103 are the same in FIGS. 18B and 18D.

Furthermore, for example, in FIG. 17, the width in the horizontal direction of each horizontal element isolation unit 104 has a width W31 at the uppermost portion and the lowermost portion thereof in FIG. 17 but becomes thinner only at the right side thereof to have a width W32 at a portion at substantially the same position in the vertical direction as the upper end of the transfer electrode 105-2 in FIG. 17. The horizontal element isolation unit 104 then extends while maintaining the width W32 and becomes thicker to have the original width W31 at a portion at substantially the same position in the vertical direction as the lower end of the transfer electrode 105-3 in FIG. 17.

In addition, for example, the width W32 in the horizontal direction of the horizontal element isolation unit 104 in FIG. 18B is smaller than the width W31 in the horizontal direction of the horizontal element isolation unit 104 in FIG. 18D. In contrast, the widths (thicknesses) in the vertical direction of the horizontal element isolation unit 104 are the same in FIGS. 18B and 18D.

Furthermore, for example, the width W21 in the horizontal direction of the vertical element isolation unit 102 in FIG. 18A is smaller than the width W22 in the horizontal direction of the vertical element isolation unit 102 in FIG. 18C. Thus, as described above with reference to FIG. 17, since the reading unit 103 and the horizontal element isolation unit 104 have smaller line widths, the width in the horizontal direction in FIG. 17 of the vertical element isolation unit 102 becomes smaller at the position of the dashed-dotted line A-A'.

In this manner, when each vertical transfer register has a smaller line width and each reading unit 103 and each horizontal element isolation unit 104 also have smaller line widths below the VL electrodes, the areas of the light receiving surfaces of the sensor units 108 can be maintained. In the example of FIG. 17, the areas of the light receiving surfaces of the sensor units 108 below the VL electrodes are the same as those in FIG. 2.

With the configuration shown in FIGS. 17 and 18, the same effects as those of the configuration shown in FIGS. 9 and 10 can still be produced, and furthermore, the influence of reduction in sensitivity, reduction in saturated signal amount, or the like on the image quality can be avoided.

With the configuration shown in FIGS. 17 and 18, however, since each reading unit 103 and each horizontal element isolation unit 104 have smaller line widths, the likelihood of occurrence of blooming that is leakage of charge stored in the sensor units 108 into the vertical transfer registers 101 becomes higher.

Figure 19:
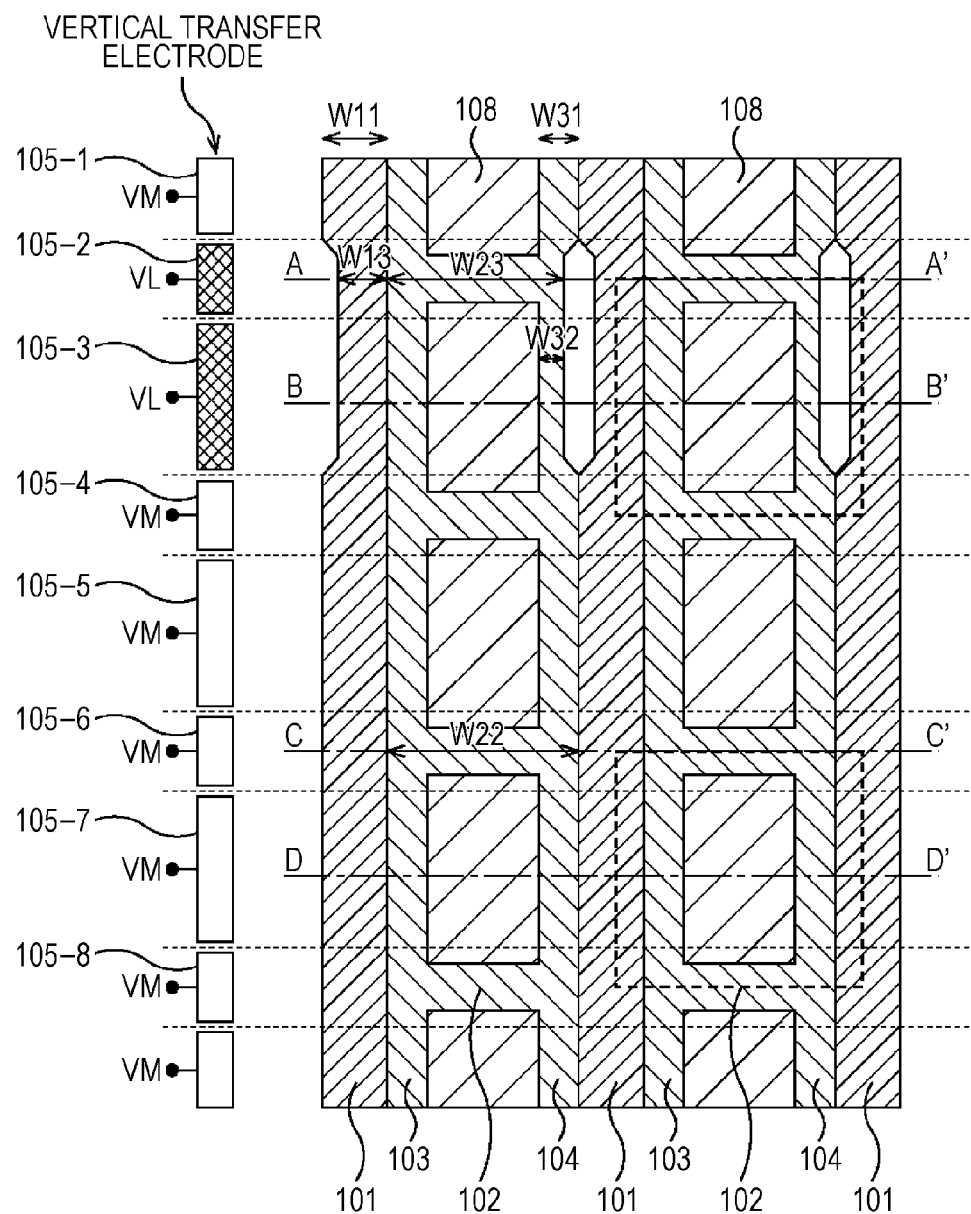
FIG. 19 is a plan view showing an example configuration of an imaging unit according to still another embodiment of the present technology.

FIG. 19 is an enlarged view of part of the imaging unit 22 in FIG. 1 in a form of a plan view showing an example configuration of an imaging unit according to still another embodiment of the present technology. FIGS. 20A to 20D show cross-sectional views along dashed-dotted lines A-A', B-B', C-C' and D-D' in FIG. 19. FIG. 20A is a cross-sectional view along the dashed-dotted line A-A' in FIG. 19 and FIG. 20B is a cross-sectional view along the dashed-dotted line B-B' in FIG. 19. Furthermore, FIG. 20C is a cross-sectional view along the dashed-dotted line C-C' in FIG. 19 and FIG. 20D is a cross-sectional view along the dashed-dotted line D-D' in FIG. 19.

In fact, FIG. 19 shows a shape of a mask used in a manufacturing process for attaching impurity to the substrate, and the configuration of the imaging unit on a completed substrate varies slightly according to the manufacturing process of the substrate. Specifically, similarly to the case described above with reference to FIGS. 11, 12, etc., each vertical transfer register 101 is arranged in contact with both of a reading unit 103 and a horizontal element isolation unit 104 while the concentration of n-type impurity and the concentration of p-type impurity are varied on the completed substrate.

In FIG. 19, parts corresponding to those in FIG. 17 are designated by the same reference numerals. Similarly, in FIG. 20, parts corresponding to those in FIGS. 18A to 18D are designated by the same reference numerals.

In the configuration shown in FIGS. 19 and 20, similarly to the configuration described above with reference to FIGS. 13 and 14, each vertical transfer register 101 has a smaller line width in such a shape that only the left side thereof is cut off below the transfer electrodes 105-2 and 105-3 that are VL electrodes.

For example, in FIG. 19, the width in the horizontal direction of the vertical transfer register 101 has a width W11 at the uppermost portion and the lowermost portion in FIG. 19 but becomes thinner in such a shape that only the left side thereof is cut off to have a width W13 at a portion at substantially the same position in the vertical direction as the upper end of the transfer electrode 105-2 in FIG. 19. The vertical transfer register 101 then extends while maintaining the width W13 and becomes thicker to have the original width W11 at a portion at substantially the same position in the vertical direction as the lower end of the transfer electrode 105-3 in FIG. 19.

In addition, for example, the width W13 in the horizontal direction of the vertical transfer register 101 in FIG. 20A is smaller than the width W11 in the horizontal direction of the vertical transfer register 101 in FIG. 20C. Furthermore, the width W13 in the horizontal direction of the vertical transfer register 101 in FIG. 20B is smaller than the width W11 in the horizontal direction of the vertical transfer register 101 in FIG. 20D. In contrast, the widths (thicknesses) in the vertical direction of the vertical transfer register 101 are all the same in FIGS. 20A to 20D.

Furthermore, in the configuration of FIGS. 19 and 20, each horizontal element isolation unit 104 has a smaller width in such a shape that only the right side thereof is cut off below the transfer electrodes 105-2 and 105-3 that are VL electrodes.

For example, in FIG. 19, the width in the horizontal direction of each horizontal element isolation unit 104 has a width W31 at the uppermost portion and the lowermost portion thereof in FIG. 19 but becomes thinner in such as shape that only the right side thereof is cut off to have a width W32 at a portion at substantially the same position in the vertical direction as the upper end of the transfer electrode 105-2 in FIG. 19. The horizontal element isolation unit 104 then extends while maintaining the width W32 and becomes thicker to have the original width W31 at a portion at substantially the same position in the vertical direction as the lower end of the transfer electrode 105-3 in FIG. 17.

In addition, for example, the width W32 in the horizontal direction of the horizontal element isolation unit 104 in FIG. 20B is smaller than the width W31 in the horizontal direction of the horizontal element isolation unit 104 in FIG. 20D. In contrast, the widths (thicknesses) in the vertical direction of the horizontal element isolation unit 104 are the same in FIGS. 20B and 20D.

Furthermore, for example, the width W23 in the horizontal direction of the vertical element isolation unit 102 in FIG. 20A is smaller than the width W22 in the horizontal direction of the vertical element isolation unit 102 in FIG. 20C. Thus, as described above with reference to FIG. 19, since each horizontal element isolation unit 104 has a smaller line width, the width in the horizontal direction in FIG. 19 of the vertical element isolation unit 102 becomes smaller at the position of the dashed-dotted line A-A'.

In this manner, when each vertical transfer register has a smaller line width and each horizontal element isolation unit 104 also has a smaller line width below the VL electrodes, the areas of the light receiving surfaces of the sensor units 108 can be maintained. In the example of FIG. 19, the areas of the light receiving surfaces of the sensor units 108 below the VL electrodes are the same as those in FIG. 2.

Figure 20:
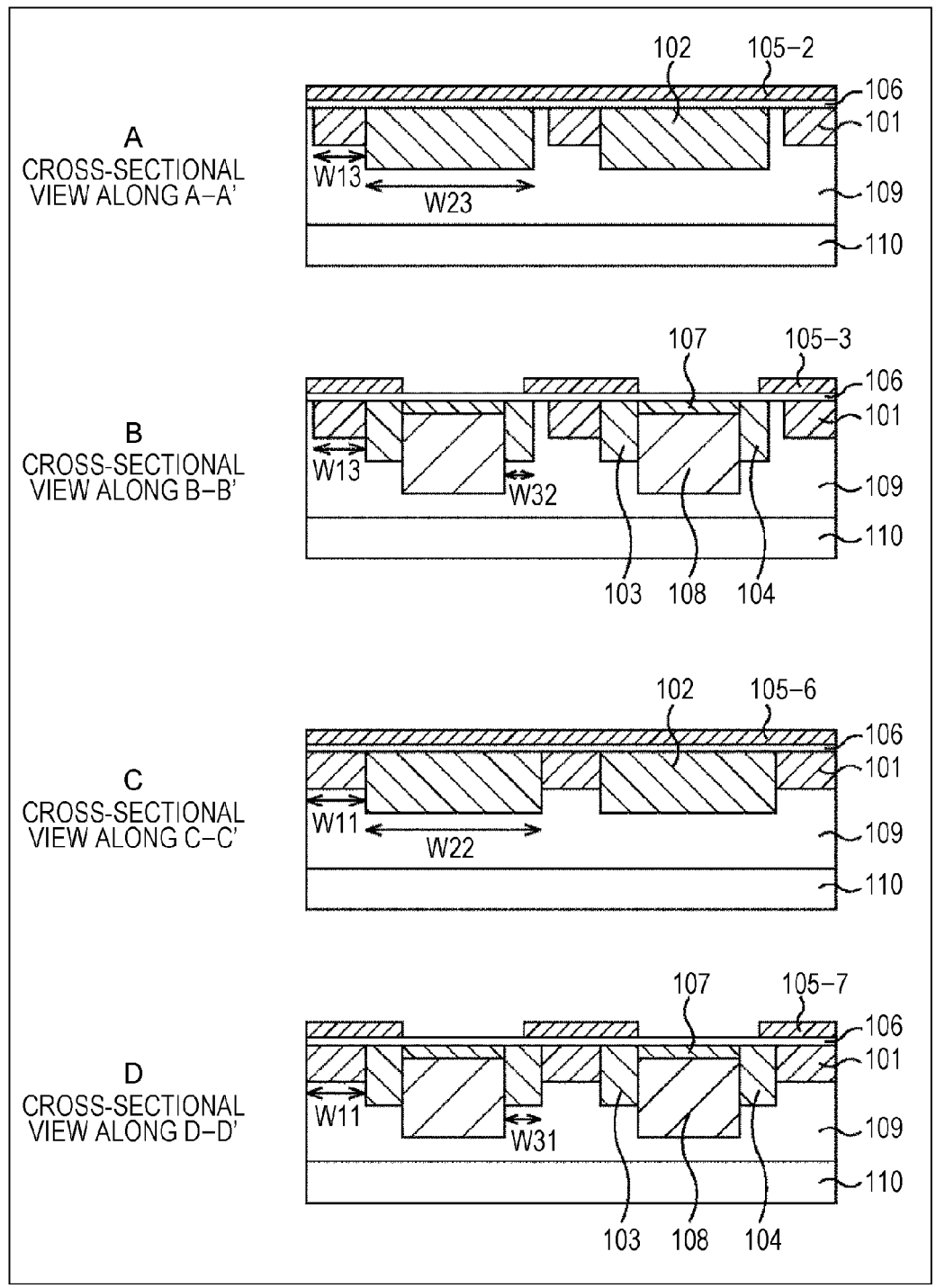
FIGS. 20A to 20D show cross-sectional views along dashed-dotted lines A-A', B-B', C-C' and D-D' in FIG. 19.

With the configuration shown in FIGS. 19 and 20, the same effects as those of the configuration shown in FIGS. 13 and 14 can be produced, and furthermore, the influence of reduction in sensitivity, reduction in saturated signal amount, or the like on the image quality can be avoided.

With the configuration shown in FIGS. 19 and 20, however, since each horizontal element isolation unit 104 has a smaller line width, the likelihood of occurrence of blooming that is leakage of charge stored in the sensor units 108 into the vertical transfer registers 101 becomes higher. With the configuration shown in FIGS. 19 and 20, however, since each reading unit 103 does not have a smaller line width, the likelihood of occurrence of blooming can be deemed to be lower than the configuration shown in FIGS. 17 and 18.

Figure 21:
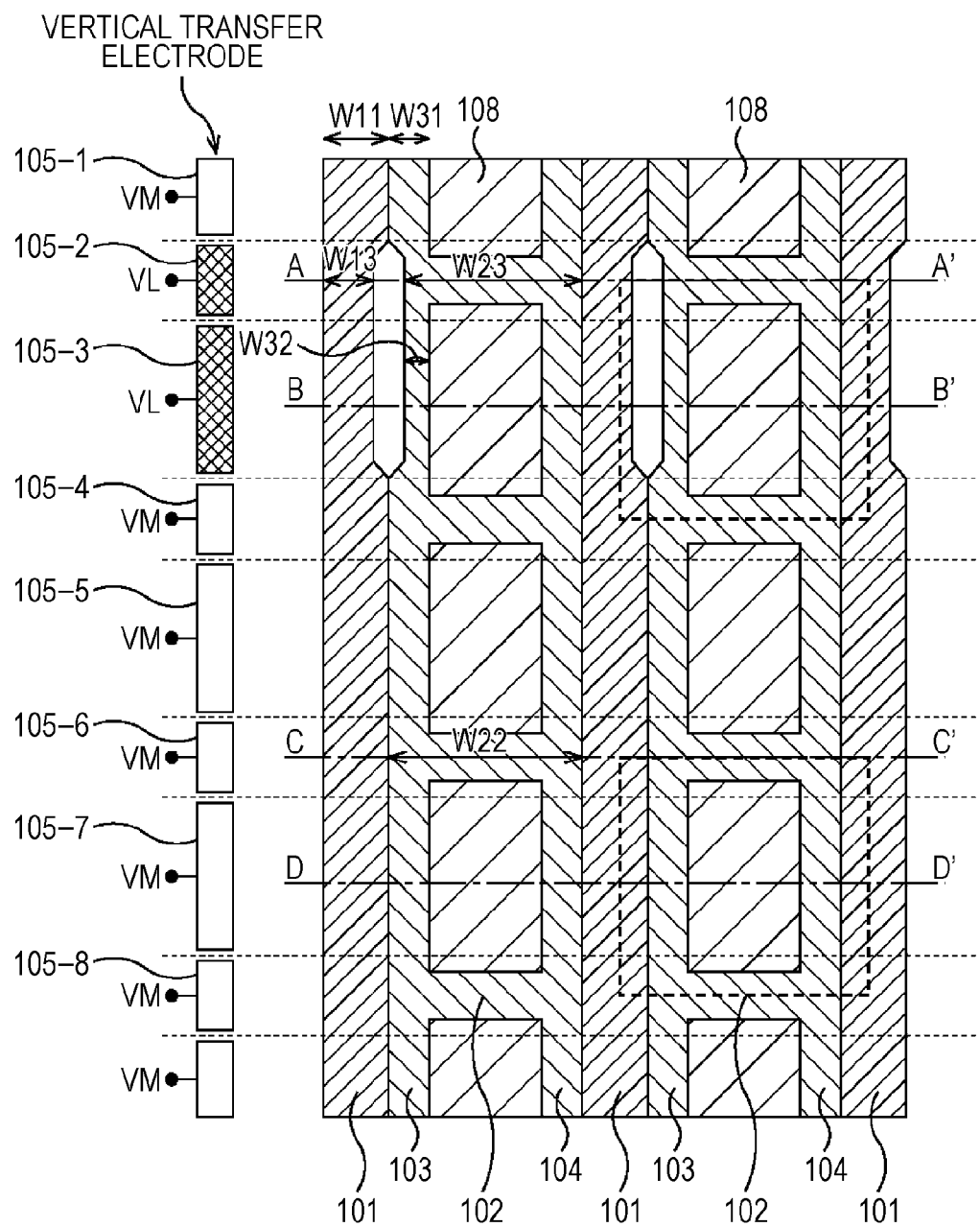
FIG. 21 is a plan view showing an example configuration of an imaging unit according to still another embodiment of the present technology.
Figure 22:
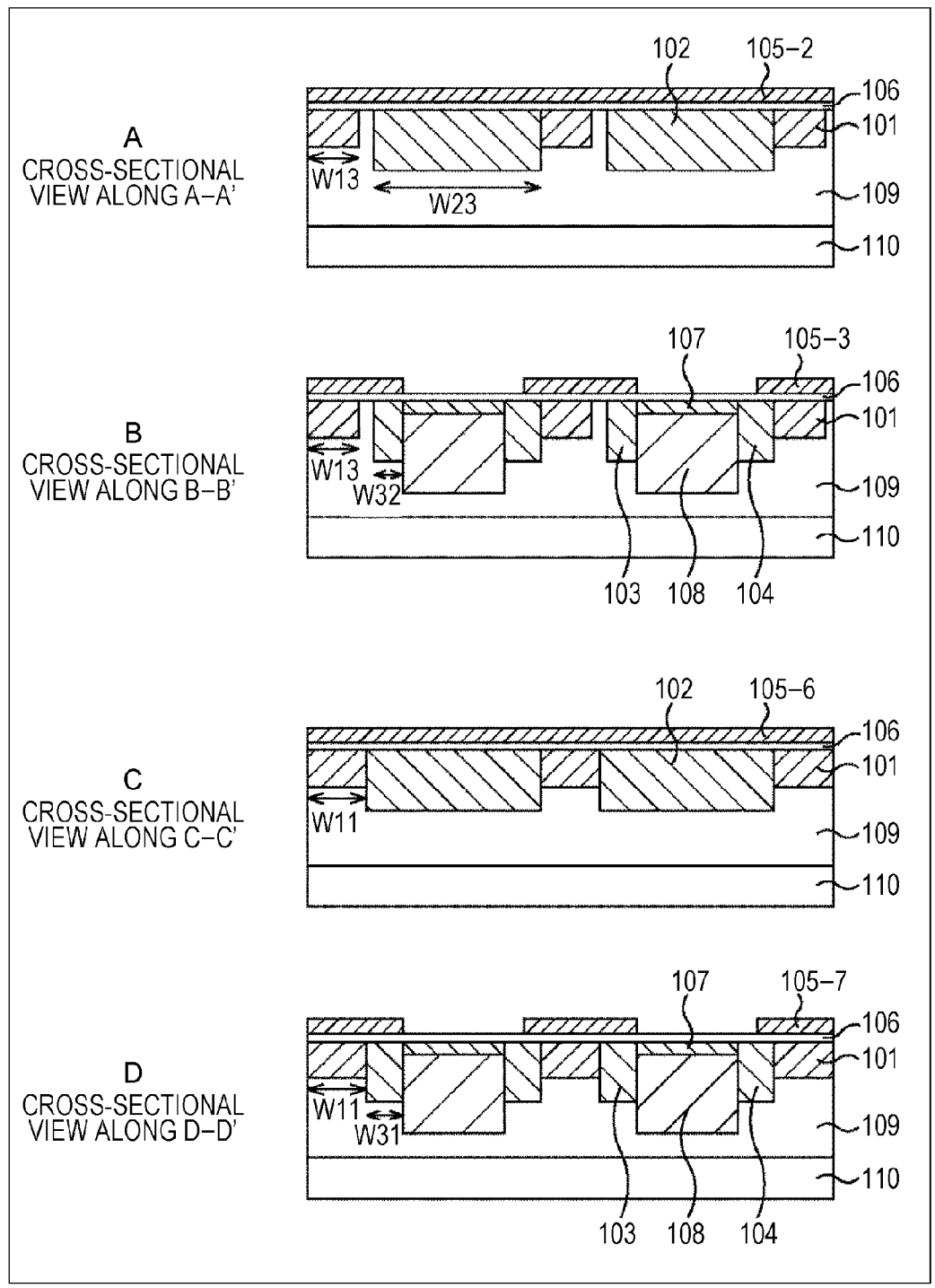
FIGS. 22A to 22D show cross-sectional views along dashed-dotted lines A-A', B-B', C-C' and D-D' in FIG. 21.

While a configuration in which each vertical transfer register has a smaller line width and only each horizontal element isolation unit 104 also has a smaller line width under the VL electrodes has been explained in FIGS. 19 and 20, a configuration in which each vertical transfer register has a smaller line width and only each reading unit 103 has a smaller line width may be used. A configuration in this case is shown in FIGS. 21 and 22. Detailed description thereof is not provided herein.

Methods of reducing the amount of doped n-type impurity by making the line width of each vertical transfer register 101 below VL electrodes smaller to suppress occurrence of white flaws have been described above. The amount of doped n-type impurity may be reduced by lowering the concentration of n-type impurity forming each vertical transfer register 101 below VL electrodes, for example. A configuration in this case is shown in FIGS. 23 and 24.

Figure 23:
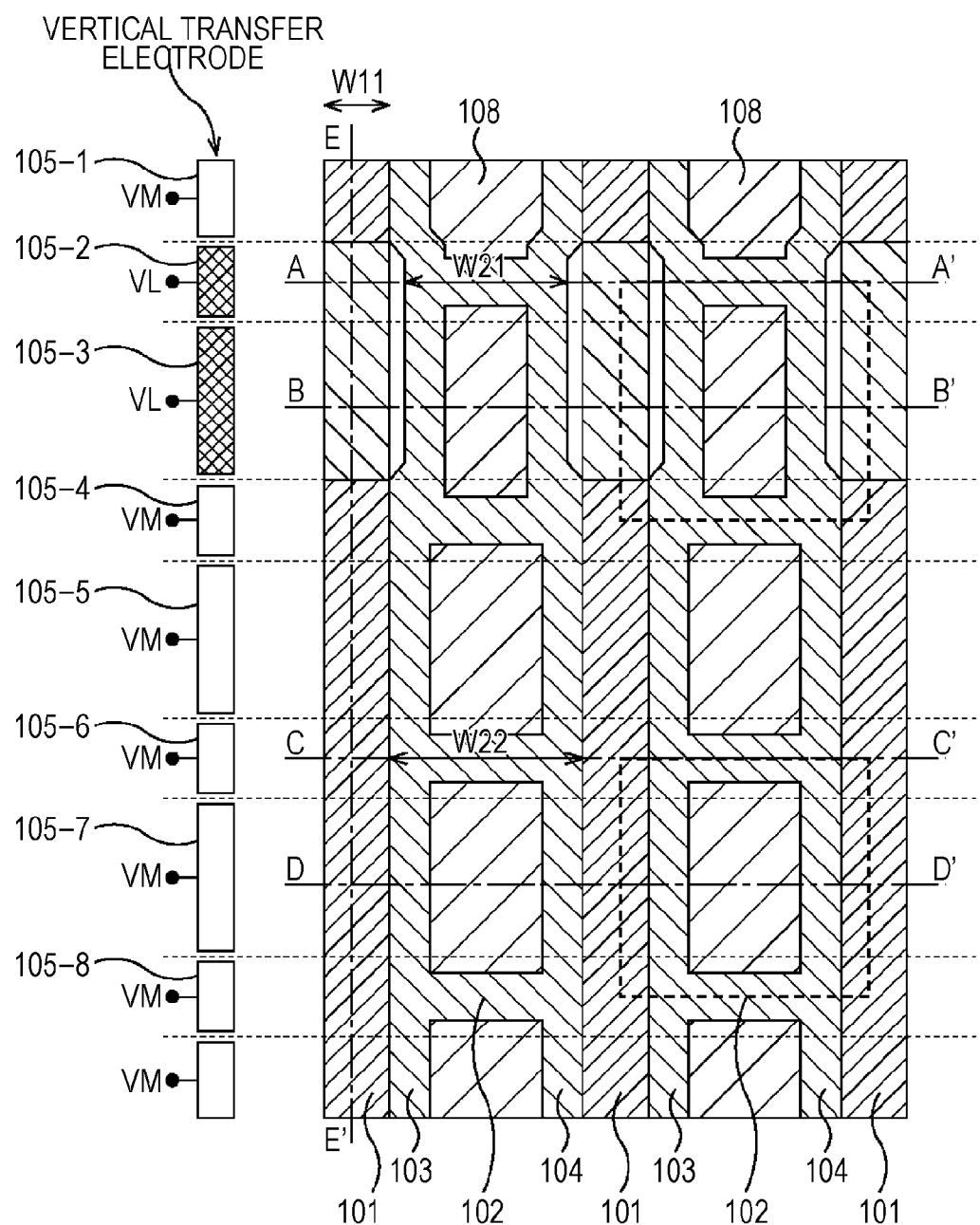
FIG. 23 is a plan view showing an example configuration of an imaging unit according to still another embodiment of the present technology.
Figure 24:
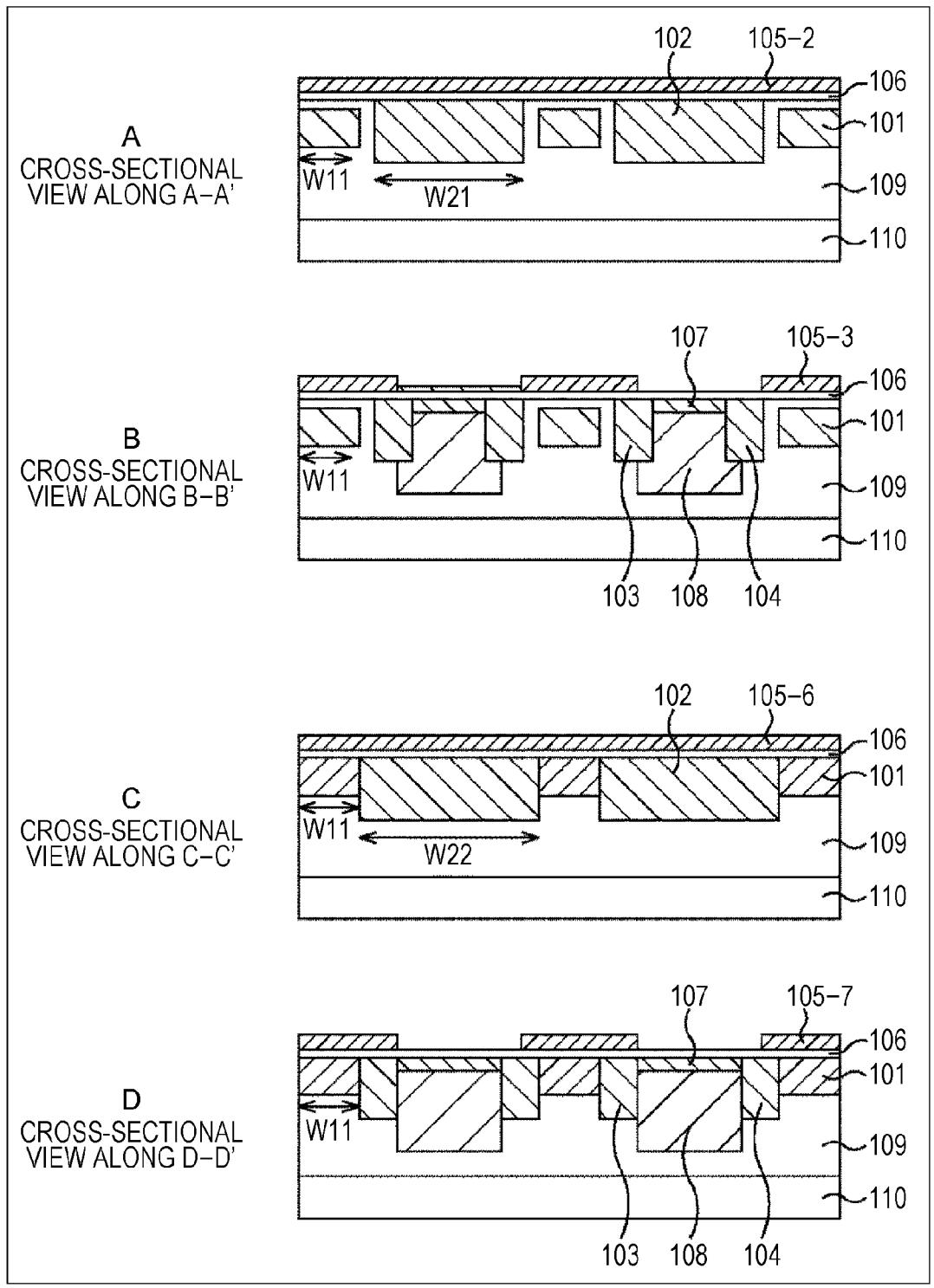
FIGS. 24A to 24D show cross-sectional views along dashed-dotted lines A-A', B-B', C-C' and D-D' in FIG. 23.

FIG. 23 is an enlarged view of part of the imaging unit 22 in FIG. 1 in a form of a plan view showing an example configuration of an imaging unit according to still another embodiment of the present technology. FIGS. 24A to 24D show cross-sectional views along dashed-dotted lines A-A', B-B', C-C' and D-D' in FIG. 23. FIG. 24A is a cross-sectional view along the dashed-dotted line A-A' in FIG. 23 and FIG. 24B is a cross-sectional view along the dashed-dotted line B-B' in FIG. 23. Furthermore, FIG. 24C is a cross-sectional view along the dashed-dotted line C-C' in FIG. 23 and FIG. 24D is a cross-sectional view along the dashed-dotted line D-D' in FIG. 23.

In fact, FIG. 23 shows a shape of a mask used in a manufacturing process for attaching impurity to the substrate, and the configuration of the imaging unit on a completed substrate varies slightly according to the manufacturing process of the substrate. Specifically, similarly to the case described above with reference to FIGS. 11, 12, etc., each vertical transfer register 101 is arranged in contact with both of a reading unit 103 and a horizontal element isolation unit 104 while the concentration of n-type impurity and the concentration of p-type impurity are varied on the completed substrate.

In FIG. 23, parts corresponding to those in FIG. 9 are designated by the same reference numerals. Similarly, in FIG. 24, parts corresponding to those in FIGS. 10A to 10D are designated by the same reference numerals.

In the configuration shown in FIGS. 23 and 24, unlike the configuration described above with reference to FIGS. 9 and 10, the line width of each vertical transfer register 101 below the transfer electrodes 105-2 and 105-3 that are VL electrodes is not decreased. Instead, the concentration of n-type impurity forming each vertical transfer resister 101 arranged below the transfer electrodes 105-2 and 105-3 is lowered. In FIGS. 23 and 24, the difference in concentration of n-type impurity is expressed by changing the hatching pattern of the vertical transfer registers 101.

In the configuration shown in FIGS. 23 and 24, since the features other than those described above are the same as those described with reference to FIGS. 9 and 10, detailed description thereof will not be repeated.

Figure 25:
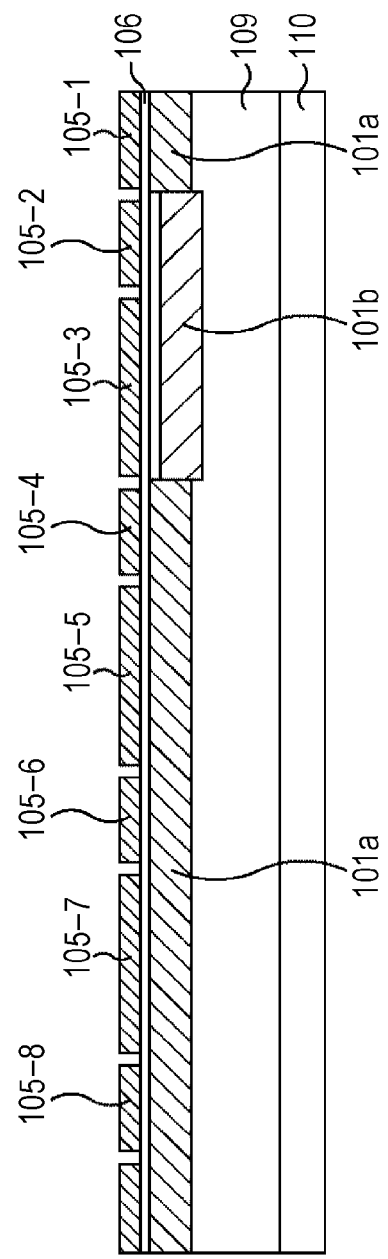
FIG. 25 is a cross-sectional view along a dashed-dotted line E-E' in FIG. 23.

FIG. 25 is a cross-sectional view in the longitudinal direction of vertical transfer registers 101 along a dashed-dotted line E-E' in FIG. 23. As shown in FIG. 25, an n-type impurity region 101b below the transfer electrodes 105-2 and 105-3 that are VL electrodes has a lower n-type impurity concentration than the other n-type impurity regions 101a. Specifically, the concentration of n-type impurity for forming each n-type impurity region 101a and that of n-type impurity for forming each n-type impurity region 101b are different in manufacturing the substrate.

FIGS. 26A and 26B show cross-sectional views for explaining the configuration of an imaging unit on a completed substrate taking impurity dispersion in the manufacturing process into consideration similarly to FIG. 11. FIG. 26A is a cross-sectional view along the dashed-dotted line B-B' in FIG. 23 and corresponds to FIG. 24B. FIG. 26B is a cross-sectional view along the dashed-dotted line D-D' in FIG. 23 and corresponds to FIG. 24D.

While each vertical transfer register 101 and each reading unit 103 are drawn as being arranged separately from each other in FIGS. 24B and 24D, the vertical transfer register 101 and the reading unit 103 are drawn as being in contact with each other in FIGS. 26A and 26B. Furthermore, while each vertical transfer register 101 and each horizontal element isolation unit 104 are drawn as being arranged separately from each other in FIGS. 24B and 24D, each vertical transfer register 101 and each horizontal element isolation unit 104 are drawn as being in contact with each other in FIGS. 26A and 26B.

Thus, as a result of impurity dispersion in the manufacturing process, the n-type impurity regions (vertical transfer registers 101) and the p-type impurity regions (reading units 103 and horizontal element isolation units 104) have dispersed. When impurity is attached by using the mask as shown in FIG. 23, however, the concentration of n-type impurity is high at the center of the line of each vertical transfer register 101 and becomes lower toward both ends thereof, for example. Furthermore, the concentration of p-type impurity is high at the center of the line of each reading unit 103 or each horizontal element isolation unit 104 and becomes lower toward both ends thereof.

Figure 26:
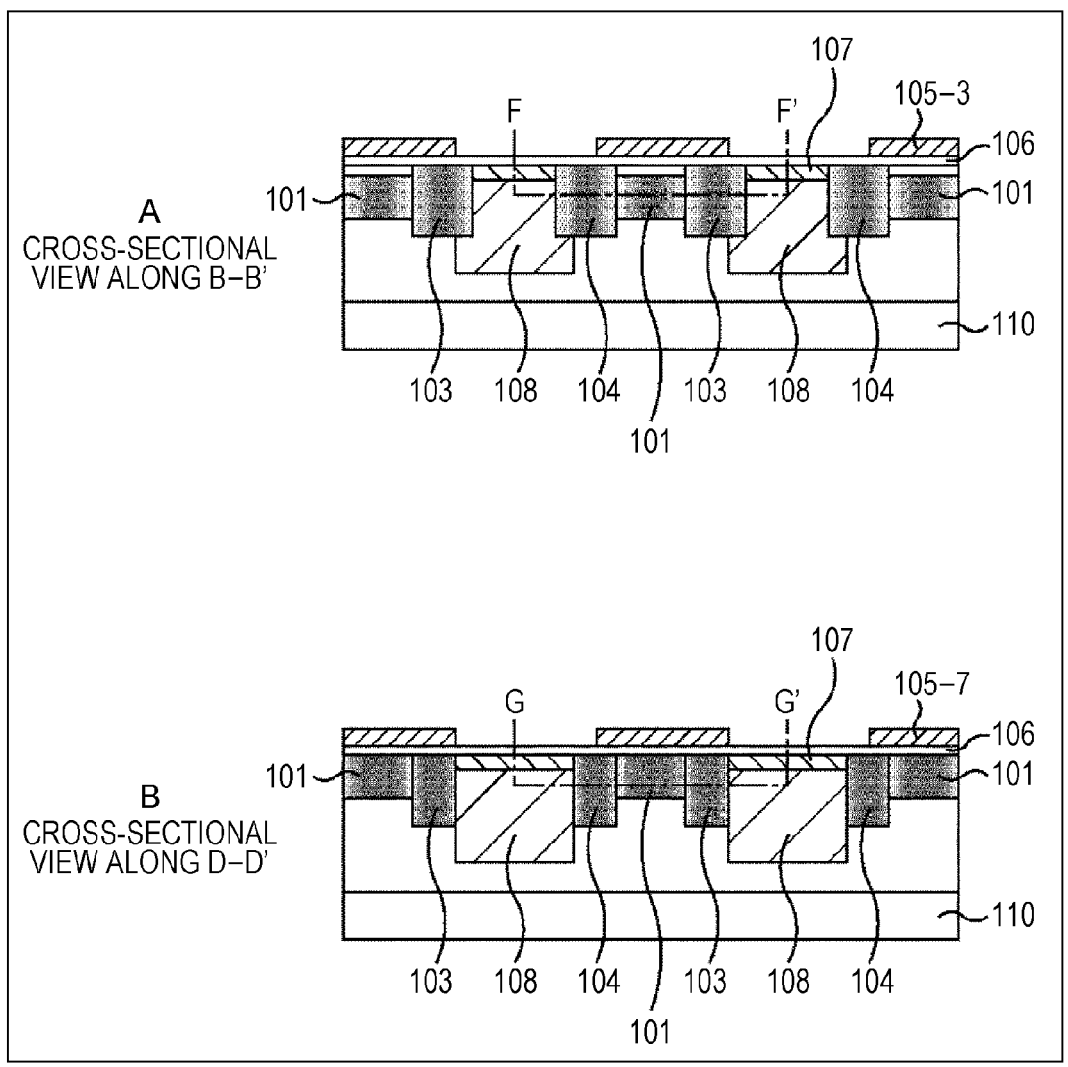
FIGS. 26A and 26B show cross-sectional views for explaining the configuration of an imaging unit on a completed substrate.

In FIG. 26, the state in which the concentration of n-type impurity is high at the center of the line of each vertical transfer register 101 and becomes lower toward both ends thereof is expressed by a gradation. Similarly, the state in which the concentration of p-type impurity is high at the center of the line of each reading unit 103 or each horizontal element isolation unit 104 and becomes lower toward both ends thereof is expressed by a gradation.

Figure 27:
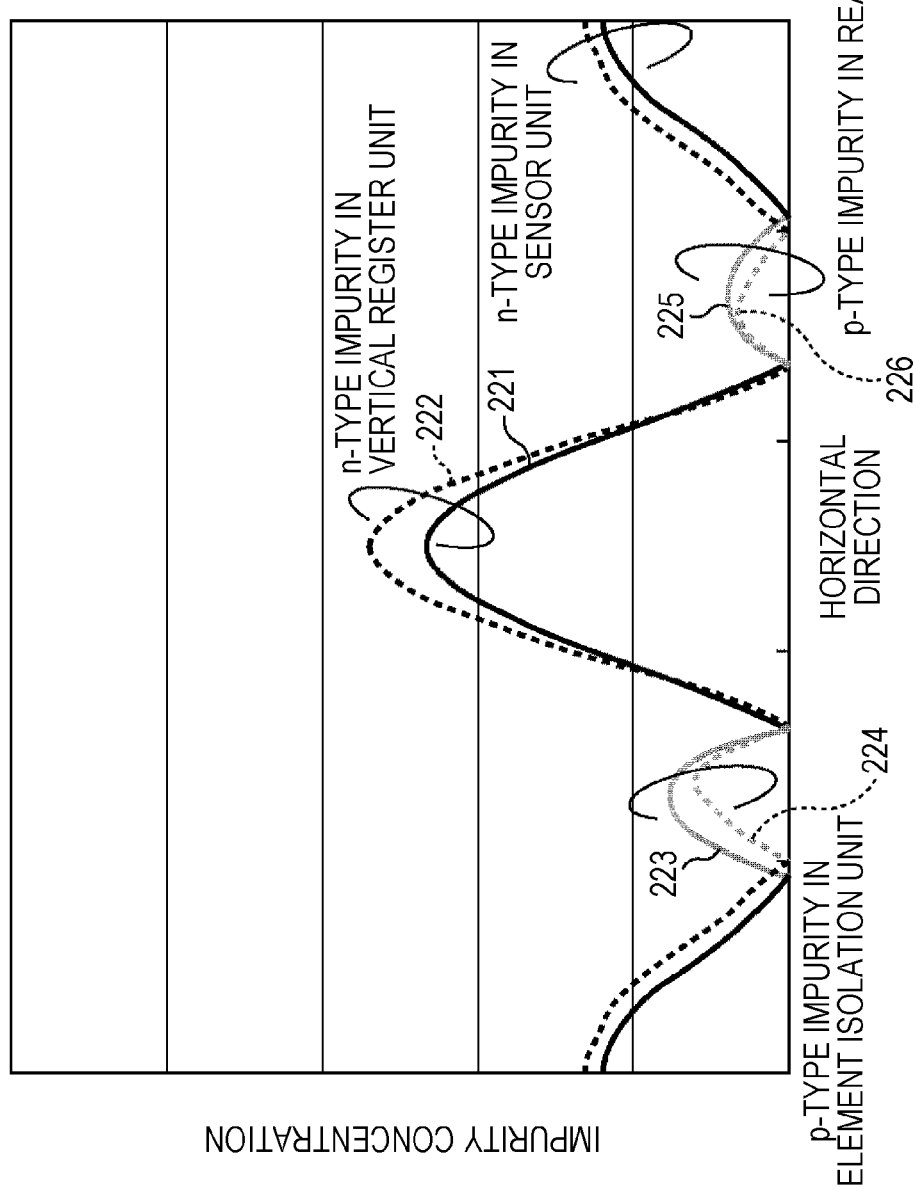
FIG. 27 is a graph for explaining variation in impurity concentration.

FIG. 27 is a graph explaining variation in the impurity concentration described above. In FIG. 27, the horizontal axis represents the position in the horizontal direction in FIGS. 26A and 26B and the vertical axis represents the impurity concentration.

In FIG. 27, a solid line 221 represents variation in the concentration of n-type impurity at a dashed-dotted line F-F' in FIG. 26A, and a dotted line 222 represents variation in the concentration of n-type impurity at a dashed-dotted line G-G' in FIG. 26B. Note that the concentration of n-type impurity around the center in FIG. 27 represents the concentration of n-type impurity of the vertical transfer register 101, and the concentrations of n-type impurity around the left and right ends in FIG. 27 represent the concentrations of n-type impurity of the sensor units 108.

Furthermore, in FIG. 27, a solid line 223 represents variation in the concentration of p-type impurity at the dashed-dotted line F-F' in FIG. 26A, and a dotted line 224 represents variation in the concentration of p-type impurity at the dashed-dotted line G-G' in FIG. 26B. Note that the solid line 223 and the dotted line 224 represent the concentrations of p-type impurity of the horizontal element isolation unit 104.

The solid line 223 changes more sharply than the dotted line 224. Specifically, the solid line 223 and the dotted line 224 both form peaks at a point on the left side in FIG. 27 and incline gently leftward and rightward therefrom, and the inclination of the solid line 223 is sharper.

Furthermore, in FIG. 27, a solid line 225 represents variation in the concentration of p-type impurity at the dashed-dotted line F-F' in FIG. 26A, and a dotted line 226 represents variation in the concentration of p-type impurity at the dashed-dotted line G-G' in FIG. 26B. Note that the solid line 225 and the dotted line 226 represent the concentrations of p-type impurity of the reading unit 103.

The solid line 225 changes more sharply than the dotted line 226. Specifically, the solid line 225 and the dotted line 226 both form peaks at a point on the right side in FIG. 27 and incline gently leftward and rightward therefrom, and the inclination of the solid line 225 is sharper.

With the configuration of the imaging unit 22 as described above with reference to FIGS. 23 to 27, the influence of white flaws can still be reduced without preventing the decrease in the pixel size of solid-state image sensors.

Specifically, with the configuration of FIGS. 23 and 24, the n-type impurity concentration of the vertical transfer registers is made lower below the VL electrodes where occurrence of white flaws having influence on the image quality is significant. As a result, the amount of doped n-type impurity below VL electrodes is reduced and the amount of n-type impurity per unit area becomes smaller below the VL electrodes on the completed substrate, which can suppress occurrence of white flaws having influence on the image quality. Thus, the total amount of n-type impurity below the VL electrodes is reduced.

At the same time, with the present technology, the centers of the lines of the reading units 103 and the horizontal element isolation units 104 are farther from the vertical transfer registers below the VL electrodes. As a result, the vertical transfer registers 101 become less likely to be influenced by dispersion of p-type impurity of the adjacent reading units 103 and horizontal element isolation units 104, and the potential can be made sufficiently deep even with the reduced amount of doped n-type impurity. Thus, a desired potential can be obtained even when the n-type impurity concentration of the vertical transfer registers 101 is lowered.

While it is explained in FIG. 25 that the concentration of n-type impurity for forming each n-type impurity region 101a and that of n-type impurity for forming each n-type impurity region 101b are different in manufacturing the substrate, a manufacturing method different therefrom may be used. A manufacturing method different from that in FIG. 25 will be described with reference to FIG. 28.

Figure 28:
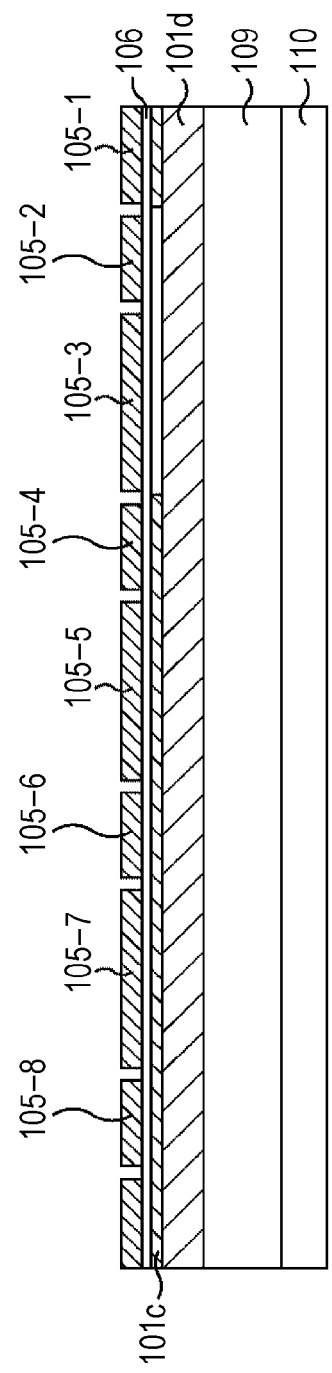
FIG. 28 is a cross-sectional view for explaining another configuration of an imaging unit on a completed substrate.

FIG. 28 is a cross-sectional view in the longitudinal direction of vertical transfer registers 101 along a dashed-dotted line E-E' in FIG. 23. In this example, an n-type impurity region 101d having a relatively low concentration is formed below all the transfer electrodes 105, and an n-type impurity region 101c having a relatively high concentration is formed thereon. The n-type impurity region 101c, however, is not formed below the transfer electrodes 105-2 and 105-3 that are VL electrodes.

Specifically, in the case of FIG. 28, an n-type impurity region forming each vertical transfer register 101 is constituted by two layers but one layer of n-type impurity region lies below the VL electrodes.

As a result of using the manufacturing method as described above with reference to FIG. 28, the substrate can be manufactured more easily than the case of FIG. 25, for example. Specifically, while a considerably high technology level is required to reproduce the n-type impurity region 101b at a highly accurate position in the case of FIG. 25, such a high technology level is not required for the manufacture as in FIG. 28.

Note that, with the configuration described above with reference to FIGS. 9 and 10, the areas of the light receiving surfaces of the sensor units 108 below the VL electrodes are reduced. As a result, although the influence on the entire solid-state image sensor is considered to be minor, there is a concern about influence of reduction in saturated signal amount or the like. For example, the reduction in saturated signal amount can be suppressed by additionally doping n-type impurity into the n-type impurity regions corresponding to the sensor units below the VL electrodes.

Figure 29:
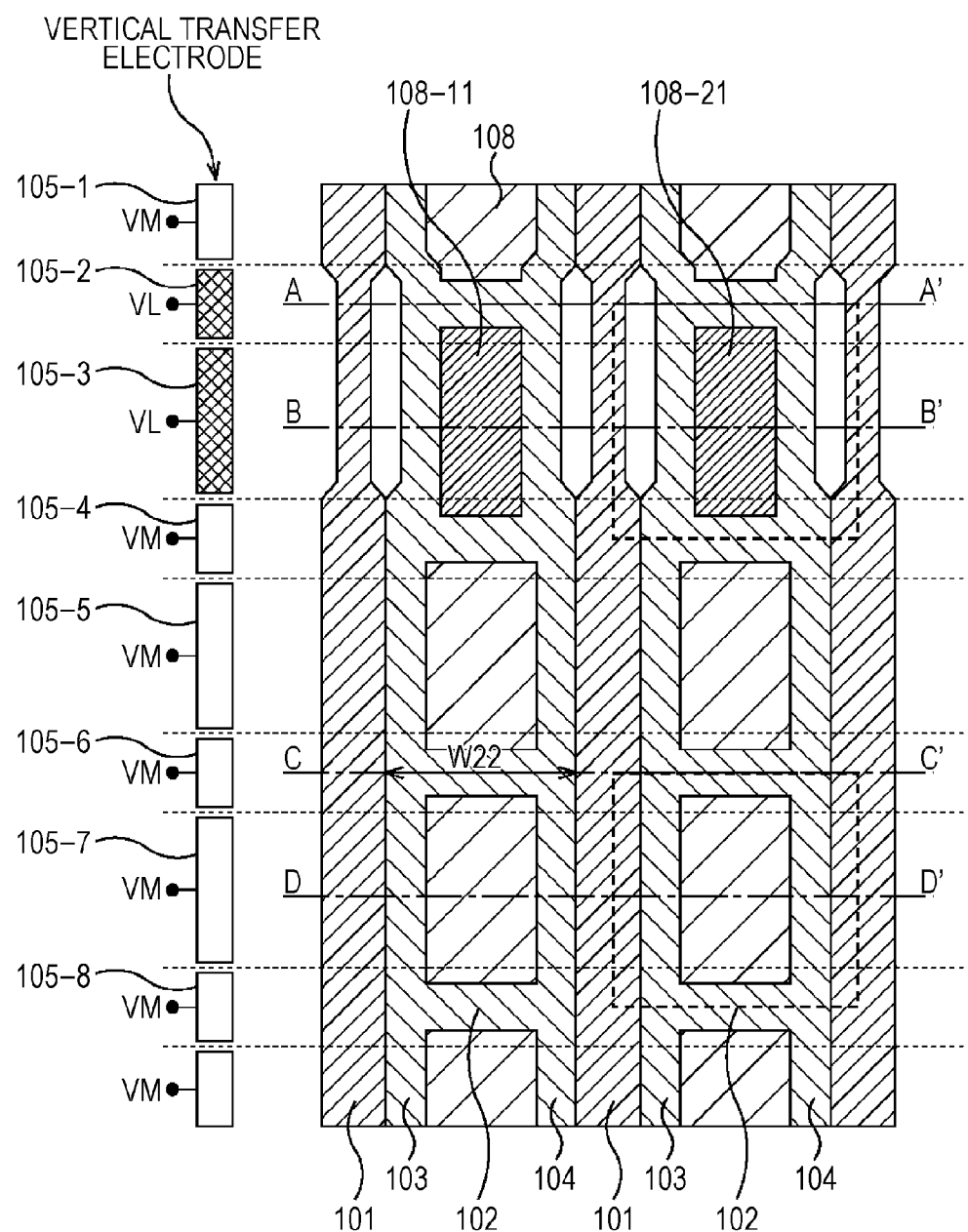
FIG. 29 is a plan view showing an example configuration of an imaging unit according to still another embodiment of the present technology.

As shown in FIG. 29, for example, n-type impurity may be additionally doped into the n-type impurity regions corresponding to the sensor units below the VL electrodes. In FIG. 29, parts corresponding to those in FIG. 9 are designated by the same reference numerals.

In the example of FIG. 29, n-type impurity is additionally doped into the sensor units 108-11 and 108-21 arranged below the transfer electrodes 105-2 and 105-3 that are VL electrodes among multiple sensor units. In FIG. 29, the additional doping of n-type impurity is expressed by hatching of the sensor units 108-11 and 108-21. Since the configuration of the other parts in FIG. 29 is the same as that in FIG. 9, detailed description thereof will not be repeated.

With the configuration as shown in FIG. 29, the potential of the sensor units 108-11 and 108-21 can be made sufficiently deep, and reduction in saturated signal amount can be suppressed.

Similarly, with the configurations described above with reference to FIGS. 13, 15, and 23, the reduction in saturated signal amount can be suppressed by additionally doping n-type impurity into the n-type impurity regions corresponding to the sensor units below the VL electrodes.

While an example in which the reduction in saturated signal amount is suppressed by additionally doping n-type impurity is described herein, the reduction in saturated signal amount can also be suppressed by changing the amount of p-type impurity doped in the surfaces of the sensor units 108-11 and 108-21.

While the configuration of the imaging unit 22 suitable for charge transfer when a moving image is captured is described above with reference to FIGS. 4 to 6, the present technology may be applied to a configuration of the imaging unit 22 suitable for charge transfer when a static image is captured, for example.

Figure 30:
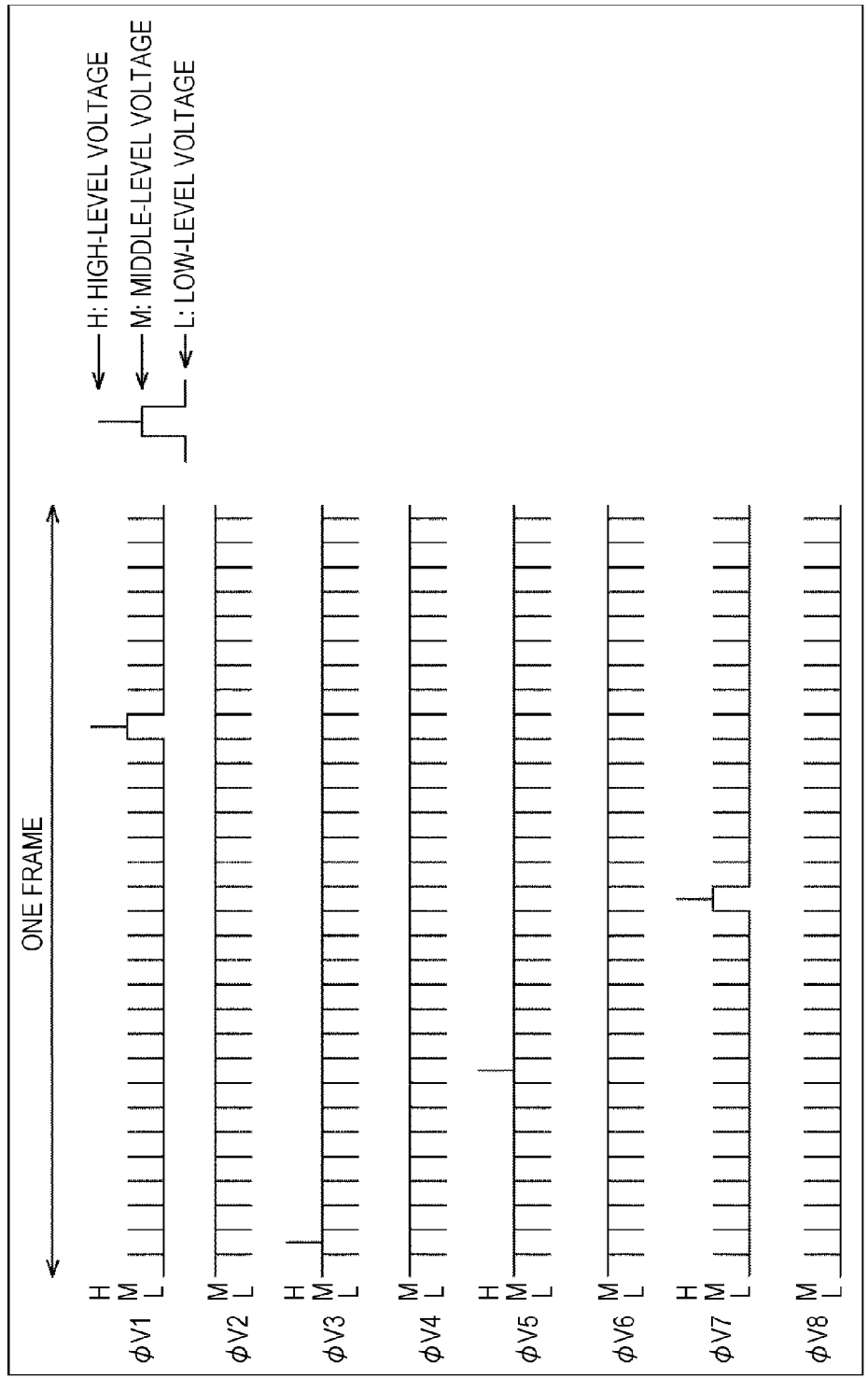
FIG. 30 is a timing chart of charge transfer when a static image is captured by the solid-state imaging device.

FIG. 30 is a timing chart of charge transfer when a static image is captured by the solid-state imaging device 10. Similarly to FIG. 4, FIG. 30 shows waveforms of the transfer clock signals $\phi$V1 to $\phi$V8. In FIG. 30, vertical lines actually represent pulses of the signals.

The waveforms of the transfer clock signals $\phi$V1 to $\phi$V8 change to voltage values of H (high-level voltage), M (middle-level voltage), and L (low-level voltage). For each of the signals, a part represented by a horizontal line corresponds to a standby voltage.

As shown in FIG. 30, the transfer clock signals $\phi$V1 to $\phi$V8 are applied to the transfer electrodes with phases shifted periodically. The vertical transfer registers are controlled by the transfer clock signals applied to the transfer electrodes so that the potential distribution of the potential well changes sequentially, and function as what are called shift registers configured to transfer the charges in the potential well in the phase shift direction of the transfer clock signals.

Figure 31:
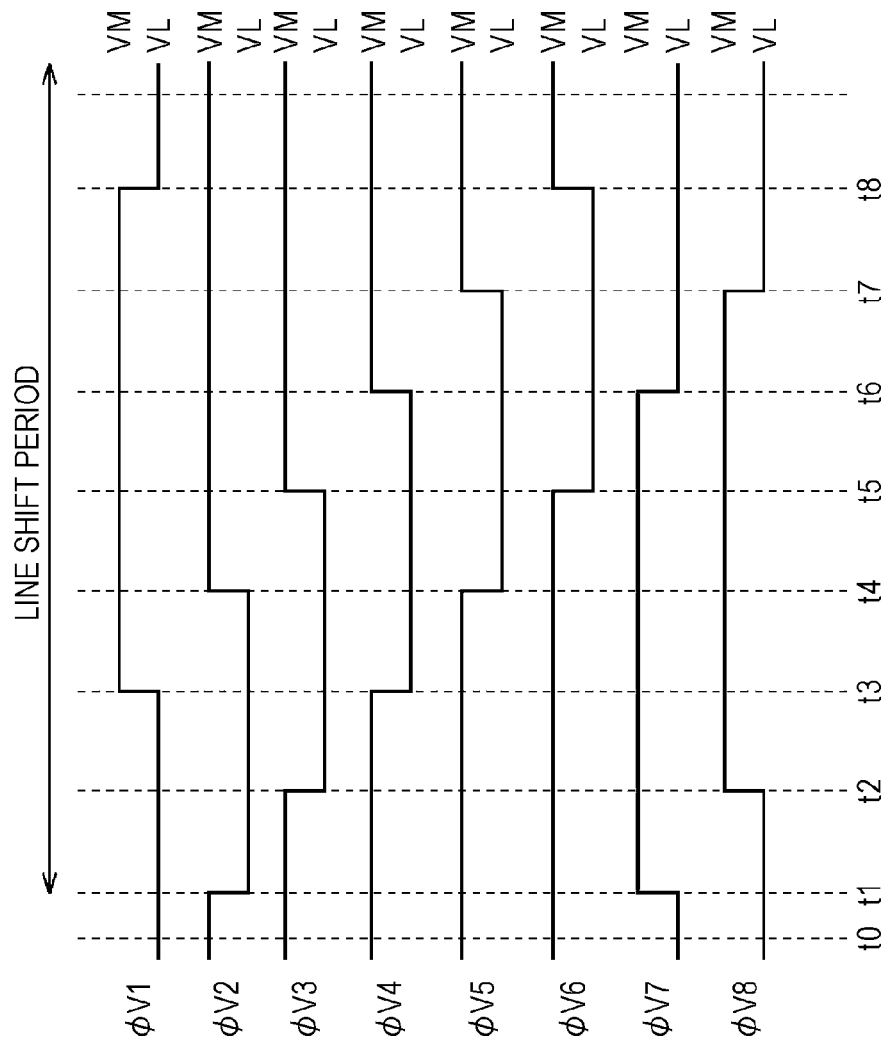
FIG. 31 is an enlarged chart of waveforms of transfer clock signals in FIG. 30.

FIG. 31 is chart corresponding to FIG. 5 in a form of an enlarged chart of waveforms of the transfer clock signals $\phi$V1 to $\phi$V8 in FIG. 30. In this example, the waveforms of the transfer clock signals $\phi$V1 to $\phi$V8 at time t0 to time t8 are shown. As shown in FIG. 31, the transfer clock signals $\phi$V1 to $\phi$V8 are pulsed with shifted phases.

Figure 32:
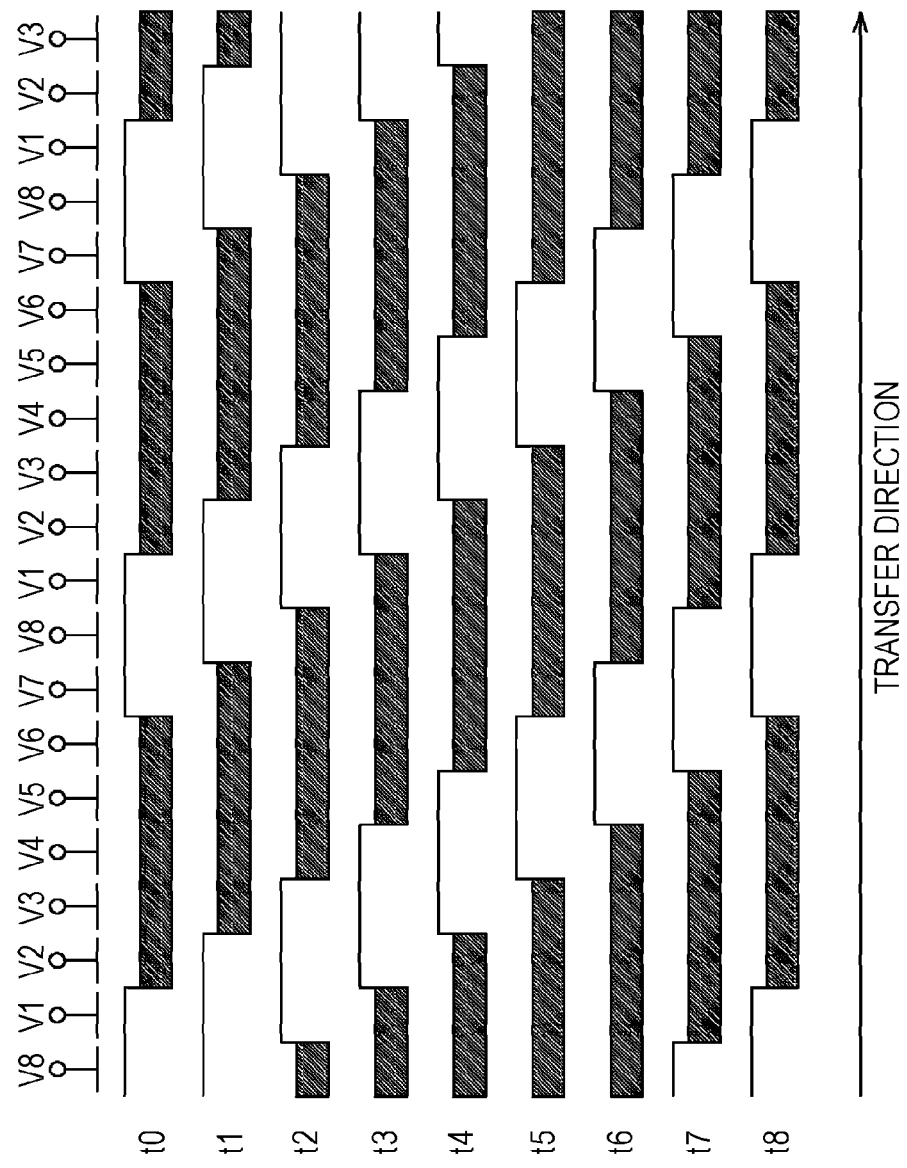
FIG. 32 is a chart showing potentials of transfer electrodes at respective times in FIG. 31.

FIG. 32 is a chart corresponding to FIG. 6, and shows potentials of the transfer electrodes at time t0 to time t8 in FIG. 31. Note that the transfer electrodes to which the transfer clock signals $\phi$V1 to $\phi$V8 are applied are referred to as transfer electrodes V1 to V8, respectively. In FIG. 31, parts shown by thick black horizontal lines represent the potential well, and parts shown as white projections represent potential barriers.

As shown in FIGS. 30 to 32, in charge transfer when a static image is captured, the transfer electrodes V1, V7, and V8 are VL electrodes, and the transfer electrodes V2 to V6 are VM electrodes.

Thus, in the case where the present technology is applied to a configuration of the imaging unit 22 suitable for charge transfer when a static image is captured, the number of VL electrodes needs to be set to three in the configurations described above with reference to FIG. 9, etc. In addition, the configurations of the vertical transfer registers 101, the reading units 103 and the horizontal element isolation units 104 below the three VL electrodes may be according to the embodiments described above.

Furthermore, the number of VL electrodes may change depending on the design of the device, the present technology can still be applied to such cases.

Note that the present technology is not limited to application to solid-state image sensors such as CCD image sensors. Specifically, the present technology can be applied to all aspects of electronic devices using solid-state image sensors in image capturing units (photoelectric conversion units) such as imaging devices such as digital still cameras and video cameras, portable terminal devices having imaging functions, and copiers using solid-state image sensors in image capturing units. A solid-state image sensor may be in a form of one-chip, a form in which multiple chips are stacked or arranged adjacent to one another, or a modular form having an imaging function in which an imaging unit, a signal processor or an optical system are packaged together.

FIG. 33 is a block diagram showing an example configuration of a camera device that is an electronic device to which the present technology is applied.

The camera device 600 in FIG. 33 includes an optical unit 601 including a lens group and the like, a solid-state imaging device (imaging device) 602 having the configurations of pixels 2 described above, and a DSP circuit 603 that is a camera signal processing circuit. The camera device 600 also includes a frame memory 604, a display unit 605, a recording unit 606, an operation unit 607, and a power supply unit 608. The DSP circuit 603, the frame memory 604, the display unit 605, the recording unit 606, the operation unit 607, and the power supply unit 608 are connected to one another via a bus line 609.

The optical unit 601 receives incident light (image light) from a subject, and focuses the light on an imaging plane of the solid-state imaging device 602. The solid-state imaging device 602 converts the amount of incident light focused on the imaging plane by the optical unit 601 into electric signals in unit of pixels and outputs the electric signals as pixel signals. A solid-state image sensor such as a CCD image sensor in which multiple unit pixels according to the embodiments described above are arranged can be used as the solid-state imaging device 602.

The display unit 605 is a panel display device such as a liquid crystal panel or an organic EL (electroluminescence) panel, and displays moving images or static images captured by the solid-state imaging device 602. The recording unit 606 records the moving images or static images captured by the solid-state imaging device 602 on a recording medium such as a video tape, or a DVD (digital versatile disk).

The operation unit 607 issues operation instructions on various functions of the camera device 600 according to user's operations. The power supply unit 608 supplies various powers to be operating powers for the DSP circuits 603, the frame memory 604, the display unit 605, the recording unit 606, and the operation unit 607 to these components to which power is to be supplied where necessary.

As described above, as a result of using the solid-state imaging device 10 according to the embodiments described above as the solid-state imaging device 602, white flaws can be made unnoticeable even with a reduced cell size, which can improve the image quality of images captured by the camera device 600 such as a video camera and a digital still camera, and furthermore, a camera module for mobile devices such as portable phones.

In addition, the present technology is not limited to application to solid-state image sensors configured to detect distribution of the amount of incident visible light and capture the light distribution as an image, but can be applied to all aspects of solid-state image sensors configured to capture distribution of the amount of incident infrared rays, X rays, particles, or the like as an image, and in a broader sense, solid-state image sensors (physical quantity distribution detecting devices) such as fingerprint sensors configured to detect distribution of other physical quantities such as pressure and capacitance.

Furthermore, the embodiments of the present technology are not limited to those described above, but various modifications may be made thereto without departing from the scope of the present technology.

The present technology can also have the following configurations.

(1)

A solid-state image sensor including:

a register unit configured to transfer charge stored in a photoelectric conversion unit and formed as an n-type impurity region extending in a first direction;

a reading unit configured to read charge from the photoelectric conversion unit into the register unit and formed as a p-type impurity region extending in the same direction as the register unit;

a horizontal element isolation unit configured to prevent leakage of charge from the photoelectric conversion unit and formed as a p-type impurity region extending in the same direction as the register unit; and multiple transfer electrodes configured to apply voltage for changing potential distribution of the register unit, wherein a total amount of n-type impurity forming the register unit below a low-level electrode having a standby voltage of a predetermined low value among the transfer electrodes is smaller than a total amount of n-type impurity forming the register unit below a middle-level electrode having a standby voltage higher than the predetermined low value.

(2)

The solid-state image sensor of (1), wherein in the second direction perpendicular to the first direction, a width of n-type impurity forming the register unit below the low-level electrode is smaller than a width of n-type impurity forming the register unit below the middle-level electrode.

(3)

The solid-state image sensor of (1), wherein a concentration of n-type impurity forming the register unit below the low-level electrode is lower than a concentration of n-type impurity forming the register unit below the middle-level electrode.

(4)

The solid-state image sensor of any one (1) to (3), wherein in the second direction perpendicular to the first direction, a highest concentration position below the low-level electrode is closer to the photoelectric conversion unit than a highest concentration position below the middle-level electrode, the highest concentration positions being positions where impurity concentration of the p-type impurity region forming the reading unit or the horizontal element isolation unit is highest.

(5)

The solid-state image sensor of (4), wherein only for highest concentration positions in the p-type impurity region forming the reading unit among the highest concentration positions, the highest concentration position below the low-level electrode is closer to the photoelectric conversion unit than the highest concentration position below the middle-level electrode.

(6)

The solid-state image sensor of (4), wherein only for highest concentration positions in the p-type impurity region forming the horizontal element isolation unit among the highest concentration positions, the highest concentration position below the low-level electrode is closer to the photoelectric conversion unit than the highest concentration position below the middle-level electrode.

(7)

The solid-state image sensor of any one of (1) to (6), wherein n-type impurity concentration of the sensor unit at a position corresponding to that of the low-level electrode is higher than n-type impurity concentration of the sensor unit at a position corresponding to that of the middle-level electrode.

(8)

The solid-state image sensor of any one of (1) to (6), wherein p-type impurity concentration of a surface of the sensor unit at a position corresponding to that of the low-level electrode is lower than p-type impurity concentration of a surface of the sensor unit at a position corresponding to that of the middle-level electrode.

(9)

A solid-state imaging device including:

a register unit configured to transfer charge stored in a photoelectric conversion unit and formed as an n-type impurity region extending in a first direction;

a reading unit configured to read charge from the photoelectric conversion unit into the register unit and formed as a p-type impurity region extending in the same direction as the register unit;

a horizontal element isolation unit configured to prevent leakage of charge from the photoelectric conversion unit and formed as a p-type impurity region extending in the same direction as the register unit;

multiple transfer electrodes configured to apply voltage to the register unit; and a timing generation circuit configured to supply voltage to the transfer electrodes to change potential distribution of the register unit, wherein a total amount of n-type impurity forming the register unit below a low-level electrode having a standby voltage of a predetermined low value among the transfer electrodes is smaller than a total amount of n-type impurity forming the register unit below a middle-level electrode having a standby voltage higher than the predetermined low value.

(10)

A camera device including:

a solid state image sensor including:
  a register unit configured to transfer charge stored in a photoelectric conversion unit and formed as an n-type impurity region extending in a first direction;
  a reading unit configured to read charge from the photoelectric conversion unit into the register unit and formed as a p-type impurity region extending in the same direction as the register unit;
  a horizontal element isolation unit configured to prevent leakage of charge from the photoelectric conversion unit and formed as a p-type impurity region extending in the same direction as the register unit; and
  multiple transfer electrodes configured to apply voltage for changing potential distribution of the register unit, wherein
  a total amount of n-type impurity forming the register unit below a low-level electrode having a standby voltage of a predetermined low value among the transfer electrodes is smaller than a total amount of n-type impurity forming the register unit below a middle-level electrode having a standby voltage higher than the predetermined low value;

an optical system configured to guide incident light to the solid state image sensor; and a signal processing circuit configured to process an image signal output from a solid-state image sensor.

(11)

The camera device of (10), further including a display unit configured to display an image captured by the solid-state imaging device.

(12)

The camera device of (10) or (11), further including a recording unit configured to record data of an image captured by the solid-state imaging device.

(13)

A camera device of any one of (10) to (12), further including an operation unit configured to generate a signal in response to an operation instruction according to a user's operation.

REFERENCE SIGNS LIST

10 Solid-state imaging device
11 CCD image sensor
12 Timing generation circuit
22 Imaging unit 22
23 Horizontal transfer register
24 Output unit
101 Vertical transfer register
102 Vertical element isolation unit
103 Reading unit
104 Horizontal element isolation unit
105 Transfer electrode
108 Sensor unit
110 Substrate

What is claimed is:

1. A solid-state image sensor comprising:
  a register unit configured to transfer charge stored in a photoelectric conversion unit and formed as an n-type impurity region extending in a first direction;
  a reading unit configured to read charge from the photoelectric conversion unit into the register unit and formed as a p-type impurity region extending in the same direction as the register unit;
  a horizontal element isolation unit configured to prevent leakage of charge from the photoelectric conversion unit and formed as a p-type impurity region extending in the same direction as the register unit; and
  multiple transfer electrodes configured to apply voltage for changing potential distribution of the register unit, wherein
  a total amount of n-type impurity forming the register unit below a low-level electrode having a standby voltage of a predetermined low value among the transfer electrodes is smaller than a total amount of n-type impurity forming the register unit below a middle-level electrode having a standby voltage higher than the predetermined low value.

2. The solid-state image sensor according to claim 1, wherein in the second direction perpendicular to the first direction, a width of n-type impurity forming the register unit below the low-level electrode is smaller than a width of n-type impurity forming the register unit below the middle-level electrode.

3. The solid-state image sensor according to claim 1, wherein a concentration of n-type impurity forming the register unit below the low-level electrode is lower than a concentration of n-type impurity forming the register unit below the middle-level electrode.

4. The solid-state image sensor according to claim 1, wherein in the second direction perpendicular to the first direction, a highest concentration position below the low-level electrode is closer to the photoelectric conversion unit than a highest concentration position below the middle-level electrode, the highest concentration positions being positions where impurity concentration of the p-type impurity region forming the reading unit or the horizontal element isolation unit is highest.

5. The solid-state image sensor according to claim 4, wherein only for highest concentration positions in the p-type impurity region forming the reading unit among the highest concentration positions, the highest concentration position below the low-level electrode is closer to the photoelectric conversion unit than the highest concentration position below the middle-level electrode.

6. The solid-state image sensor according to claim 4, wherein only for highest concentration positions in the p-type impurity region forming the horizontal element isolation unit among the highest concentration positions, the highest concentration position below the low-level electrode is closer to the photoelectric conversion unit than the highest concentration position below the middle-level electrode.

7. The solid-state image sensor according to claim 1, wherein n-type impurity concentration of the sensor unit at a position corresponding to that of the low-level electrode is higher than n-type impurity concentration of the sensor unit at a position corresponding to that of the middle-level electrode.

8. The solid-state image sensor according to claim 1, wherein p-type impurity concentration of a surface of the sensor unit at a position corresponding to that of the low-level electrode is lower than p-type impurity concentration of a surface of the sensor unit at a position corresponding to that of the middle-level electrode.

9. A solid-state imaging device comprising:
  a register unit configured to transfer charge stored in a photoelectric conversion unit and formed as an n-type impurity region extending in a first direction;
  a reading unit configured to read charge from the photoelectric conversion unit into the register unit and formed as a p-type impurity region extending in the same direction as the register unit;
  a horizontal element isolation unit configured to prevent leakage of charge from the photoelectric conversion unit and formed as a p-type impurity region extending in the same direction as the register unit;
  multiple transfer electrodes configured to apply voltage to the register unit; and
  a timing generation circuit configured to supply voltage to the transfer electrodes to change potential distribution of the register unit, wherein
  a total amount of n-type impurity forming the register unit below a low-level electrode having a standby voltage of a predetermined low value among the transfer electrodes is smaller than a total amount of n-type impurity forming the register unit below a middle-level electrode having a standby voltage higher than the predetermined low value.

10. A camera device comprising:
  a solid state image sensor including:
    a register unit configured to transfer charge stored in a photoelectric conversion unit and formed as an n-type impurity region extending in a first direction;
    a reading unit configured to read charge from the photoelectric conversion unit into the register unit and formed as a p-type impurity region extending in the same direction as the register unit;
    a horizontal element isolation unit configured to prevent leakage of charge from the photoelectric conversion unit and formed as a p-type impurity region extending in the same direction as the register unit; and multiple transfer electrodes configured to apply voltage for changing potential distribution of the register unit, wherein a total amount of n-type impurity forming the register unit below a low-level electrode having a standby voltage of a predetermined low value among the transfer electrodes is smaller than a total amount of n-type impurity forming the register unit below a middle-level electrode having a standby voltage higher than the predetermined low value;

an optical system configured to guide incident light to the solid state image sensor; and a signal processing circuit configured to process an image signal output from a solid-state image sensor.

11. The camera device according to claim 10, further comprising a display unit configured to display an image captured by the solid-state imaging device.

12. The camera device according to claim 10, further comprising a recording unit configured to record data of an image captured by the solid-state imaging device.

13. A camera device according to claim 10, further comprising an operation unit configured to generate a signal in response to an operation instruction according to a user's operation.

* * * * *